US012567687B2

(12) United States Patent
Xu et al.

(10) Patent No.: US 12,567,687 B2
(45) Date of Patent: Mar. 3, 2026

(54) HIGH SPEED ELECTRICAL CONNECTOR AND PRINTED CIRCUIT BOARD THEREOF

(71) Applicant: Amphenol East Asia Electronic Technology (Shenzhen) Co., Ltd., Shenzhen (CN)

(72) Inventors: Qigui Xu, Shenzhen (CN); E Zhao, Shenzhen (CN); Zhigang Sheng, Shenzhen (CN); Shengxian Zhou, Shenzhen (CN)

(73) Assignee: Amphenol East Asia Electronic Technology (Shenzhen) Co., Ltd., Shenzhen (CN)

( * ) Notice: Subject to any disclaimer, the term of this patent is extended or adjusted under 35 U.S.C. 154(b) by 269 days.

(21) Appl. No.: 18/365,875

(22) Filed: Aug. 4, 2023

(65) Prior Publication Data

US 2024/0106140 A1 Mar. 28, 2024

Related U.S. Application Data

(63) Continuation of application No. 17/195,403, filed on Mar. 8, 2021, now Pat. No. 11,757,215, which is a (Continued)

(30) Foreign Application Priority Data

Sep. 26, 2018 (CN) .......................... 201821577530.2

(51) Int. Cl.
*H01R 12/71* (2011.01)
*H01R 12/51* (2011.01)
(Continued)

(52) U.S. Cl.
CPC ........... *H01R 12/57* (2013.01); *H01R 12/515* (2013.01); *H01R 12/53* (2013.01); *H01R 12/716* (2013.01);
(Continued)

(58) Field of Classification Search
CPC ...... H01R 12/57; H01R 12/515; H01R 12/53; H01R 12/75; H01R 13/6461; H05K 1/184; H05K 2201/10189
See application file for complete search history.

(56) References Cited

U.S. PATENT DOCUMENTS 5,167,531 A 12/1992 Broschard, III et al.
5,281,152 A 1/1994 Takahashi et al.
(Continued)

FOREIGN PATENT DOCUMENTS

CN 101312275 A 11/2008
CN 101316012 A 12/2008
(Continued)

OTHER PUBLICATIONS

[No Author Listed], Cable Systems. Samtec. Aug. 2010. 148 pages.
(Continued)

*Primary Examiner* — Thanh Tam T Le
(74) *Attorney, Agent, or Firm* — Wolf, Greenfield & Sacks, P.C.

(57) ABSTRACT

A stacked I/O connector with surface mountable tails and a printed circuit board (PCB) configured to receive the connector. The connector may avoid terminal deformations or scratches when the connector is mounted to the PCB. The PCB may include solder pads on a single surface or both surfaces. The sold pads may be configured for the tails of the connector to be attached with a surface mount soldering technique. As a result, the connector has high density and high speed, requires, requires a smaller mounting area on a PCB, relaxes the limitations in routing PCB traces, and reduces the electrical performance deterioration caused by PCB trace routing limitations. The connector may have row-oriented terminal subassemblies, holes in the connector (Continued)

housing and other features to facilitate reliable manufacture and operation of the connector.

20 Claims, 8 Drawing Sheets

Related U.S. Application Data continuation of application No. 16/415,456, filed on May 17, 2019, now Pat. No. 10,944,189.

(51) Int. Cl.

| | |
|---|---|
| *H01R 12/53* | (2011.01) |
| *H01R 12/57* | (2011.01) |
| *H01R 12/75* | (2011.01) |
| *H01R 13/6461* | (2011.01) |
| *H05K 1/184* | (2026.01) |

(52) U.S. Cl.

CPC ......... *H01R 12/75* (2013.01); *H01R 13/6461* (2013.01); *H05K 1/184* (2013.01); *H05K 2201/10189* (2013.01)

(56) References Cited

U.S. PATENT DOCUMENTS

| | | | |
|---|---|---|---|
| 5,318,463 A | 6/1994 | Broschard, III et al. |
| 5,336,109 A | 8/1994 | Hillbish et al. |
| 5,453,016 A | 9/1995 | Clark et al. |
| 6,159,040 A | 12/2000 | Chang et al. |
| 6,589,061 B1 | 7/2003 | Korsunsky et al. |
| 7,070,446 B2 | 7/2006 | Henry et al. |
| 7,214,074 B2 | 5/2007 | Osada |
| 7,258,573 B1 | 8/2007 | Lee |
| 7,448,897 B2 | 11/2008 | Dawiedczyk et al. |
| 7,494,383 B2 | 2/2009 | Cohen et al. |
| 7,540,747 B2 | 6/2009 | Ice et al. |
| 7,540,781 B2 | 6/2009 | Kenny et al. |
| 7,543,142 B2 | 6/2009 | Sydir et al. |
| 7,554,096 B2 | 6/2009 | Ward et al. |
| 7,575,471 B2 | 8/2009 | Long |
| 7,581,990 B2 | 9/2009 | Kirk et al. |
| 7,585,186 B2 | 9/2009 | McAlonis et al. |
| 7,585,188 B2 | 9/2009 | Regnier |
| 7,588,464 B2 | 9/2009 | Kim |
| 7,588,467 B2 | 9/2009 | Chang |
| 7,594,826 B2 | 9/2009 | Kobayashi et al. |
| 7,604,490 B2 | 10/2009 | Chen et al. |
| 7,604,502 B2 | 10/2009 | Pan |
| 7,674,133 B2 | 3/2010 | Fogg et al. |
| 7,690,946 B2 | 4/2010 | Knaub et al. |
| 7,699,644 B2 | 4/2010 | Szczesny et al. |
| 7,699,663 B1 | 4/2010 | Little et al. |
| 7,722,401 B2 | 5/2010 | Kirk et al. |
| 7,731,537 B2 | 6/2010 | Amleshi et al. |
| 7,753,731 B2 | 7/2010 | Cohen et al. |
| 7,758,357 B2 | 7/2010 | Pan et al. |
| 7,764,504 B2 | 7/2010 | Phillips et al. |
| 7,771,233 B2 | 8/2010 | Gailus |
| 7,781,294 B2 | 8/2010 | Mauder et al. |
| 7,789,676 B2 | 9/2010 | Morgan et al. |
| 7,794,240 B2 | 9/2010 | Cohen et al. |
| 7,794,278 B2 | 9/2010 | Cohen et al. |
| 7,806,698 B2 | 10/2010 | Regnier |
| 7,806,729 B2 | 10/2010 | Nguyen et al. |
| 7,828,595 B2 | 11/2010 | Mathews |
| 7,871,294 B2 | 1/2011 | Long |
| 7,871,296 B2 | 1/2011 | Fowler et al. |
| 7,874,873 B2 | 1/2011 | Do et al. |
| 7,887,371 B2 | 2/2011 | Kenny et al. |
| 7,887,379 B2 | 2/2011 | Kirk |
| 7,896,659 B1 | 3/2011 | Westman et al. |
| 7,906,730 B2 | 3/2011 | Atkinson et al. |
| 7,914,304 B2 | 3/2011 | Cartier et al. |
| 7,927,143 B2 | 4/2011 | Helster et al. |
| 7,985,097 B2 | 7/2011 | Gulla |
| 8,018,733 B2 | 9/2011 | Jia |
| 8,057,267 B2 | 11/2011 | Johnescu |
| 8,083,553 B2 | 12/2011 | Manter et al. |
| RE43,427 E | 5/2012 | Dawiedczyk et al. |
| 8,182,289 B2 | 5/2012 | Stokoe et al. |
| 8,215,968 B2 | 7/2012 | Cartier et al. |
| 8,216,001 B2 | 7/2012 | Kirk |
| 8,251,745 B2 | 8/2012 | Johnescu |
| 8,267,721 B2 | 9/2012 | Minich |
| 8,272,877 B2 | 9/2012 | Stokoe et al. |
| 8,358,504 B2 | 1/2013 | McColloch et al. |
| 8,371,875 B2 | 2/2013 | Gailus |
| 8,382,524 B2 | 2/2013 | Khilchenko et al. |
| 8,465,320 B2 | 6/2013 | Long |
| 8,469,738 B2 | 6/2013 | Long |
| 8,475,210 B2 | 7/2013 | Wang |
| 8,480,413 B2 | 7/2013 | Minich et al. |
| 8,540,525 B2 | 9/2013 | Regnier et al. |
| 8,550,861 B2 | 10/2013 | Cohen et al. |
| 8,597,045 B2 | 12/2013 | Zhu |
| 8,657,627 B2 | 2/2014 | McNamara et al. |
| 8,678,860 B2 | 3/2014 | Minich et al. |
| 8,715,003 B2 | 5/2014 | Buck et al. |
| 8,715,005 B2 | 5/2014 | Pan |
| 8,740,644 B2 | 6/2014 | Long |
| 8,764,488 B2 * | 7/2014 | Zeng ................. H01R 13/6585 |
| | | | 439/108 |
| 8,771,016 B2 | 7/2014 | Atkinson et al. |
| 8,830,679 B2 | 9/2014 | Scholeno |
| 8,864,521 B2 | 10/2014 | Atkinson et al. |
| 8,870,471 B2 | 10/2014 | Ito et al. |
| 8,926,377 B2 | 1/2015 | Kirk et al. |
| 8,944,831 B2 | 2/2015 | Stoner et al. |
| 8,998,642 B2 | 4/2015 | Manter et al. |
| 9,004,942 B2 | 4/2015 | Paniauqa |
| 9,011,177 B2 | 4/2015 | Lloyd et al. |
| 9,022,806 B2 | 5/2015 | Cartier, Jr. et al. |
| 9,028,201 B2 | 5/2015 | Kirk et al. |
| 9,028,281 B2 | 5/2015 | Kirk et al. |
| 9,065,230 B2 | 6/2015 | Milbrand, Jr. |
| 9,077,115 B2 | 7/2015 | Yang |
| 9,083,130 B2 | 7/2015 | Casher et al. |
| 9,118,151 B2 | 8/2015 | Tran et al. |
| 9,124,009 B2 | 9/2015 | Atkinson et al. |
| 9,210,817 B2 | 12/2015 | Briant |
| 9,219,335 B2 | 12/2015 | Atkinson et al. |
| 9,225,085 B2 | 12/2015 | Cartier, Jr. et al. |
| 9,246,262 B2 | 1/2016 | Brown |
| 9,246,280 B2 | 1/2016 | Neer |
| 9,257,794 B2 | 2/2016 | Wanha et al. |
| 9,276,358 B2 | 3/2016 | Ista |
| 9,300,074 B2 | 3/2016 | Gailus |
| 9,337,585 B1 * | 5/2016 | Yang ................. H01R 13/6583 |
| 9,368,916 B2 | 6/2016 | Heyvaert et al. |
| 9,389,368 B1 | 7/2016 | Sharf |
| 9,450,344 B2 | 9/2016 | Cartier, Jr. et al. |
| 9,461,378 B1 | 10/2016 | Chen |
| 9,484,674 B2 | 11/2016 | Cartier, Jr. et al. |
| 9,509,101 B2 | 11/2016 | Cartier, Jr. et al. |
| 9,509,102 B2 | 11/2016 | Sharf et al. |
| 9,520,680 B2 * | 12/2016 | Hsu .................... H01R 13/6471 |
| 9,520,689 B2 | 12/2016 | Cartier, Jr. et al. |
| 9,653,829 B2 | 5/2017 | Long |
| 9,666,998 B1 | 5/2017 | de Boer et al. |
| 9,668,378 B2 | 5/2017 | Phillips |
| 9,671,582 B2 | 6/2017 | Yeh |
| 9,692,188 B2 | 6/2017 | Godana et al. |
| 9,705,255 B2 | 7/2017 | Atkinson et al. |
| 9,711,901 B2 | 7/2017 | Scholeno |
| 9,748,698 B1 | 8/2017 | Morgan et al. |
| 9,761,974 B2 | 9/2017 | L'Esperance et al. |
| 9,829,662 B2 | 11/2017 | Kurashima |
| 9,831,588 B2 | 11/2017 | Cohen |
| 9,843,135 B2 | 12/2017 | Guetig et al. |
| 9,859,658 B2 * | 1/2018 | Champion ......... H01R 13/6471 |
| 9,899,774 B2 | 2/2018 | Gailus |
| 9,915,560 B2 | 3/2018 | Ho et al. |

(56) References Cited

U.S. PATENT DOCUMENTS

| | | |
|---|---|---|
| 9,929,500 B1 | 3/2018 | Ista |
| 9,972,945 B1 * | 5/2018 | Huang ............... H01R 13/6585 |
| 10,020,614 B1 | 7/2018 | Bucher |
| 10,109,968 B2 | 10/2018 | Khazen |
| 10,122,129 B2 | 11/2018 | Milbrand, Jr. et al. |
| 10,128,627 B1 | 11/2018 | Kazav |
| 10,153,571 B2 | 12/2018 | Kachlic |
| 10,186,814 B2 | 1/2019 | Khilchenko et al. |
| 10,211,577 B2 | 2/2019 | Milbrand, Jr. et al. |
| 10,243,304 B2 * | 3/2019 | Kirk ................... H01R 13/6473 |
| 10,276,995 B2 | 4/2019 | Little |
| 10,283,910 B1 * | 5/2019 | Chen ........................ H01R 4/04 |
| 10,348,040 B2 | 7/2019 | Cartier, Jr. et al. |
| 10,367,283 B2 | 7/2019 | L'Esperance et al. |
| 10,367,308 B2 * | 7/2019 | Little ................... H01R 4/2404 |
| 10,374,355 B2 | 8/2019 | Ayzenberg et al. |
| 10,381,767 B1 | 8/2019 | Milbrand, Jr. et al. |
| 10,431,936 B2 | 10/2019 | Horning et al. |
| 10,446,960 B2 | 10/2019 | Guy Ritter et al. |
| 10,511,118 B2 | 12/2019 | Beltran et al. |
| 10,511,128 B2 | 12/2019 | Kirk et al. |
| 10,551,580 B2 | 2/2020 | Regnier et al. |
| 10,555,437 B2 | 2/2020 | Little |
| 10,588,243 B2 | 3/2020 | Little et al. |
| 10,601,181 B2 | 3/2020 | Lu et al. |
| 10,630,002 B2 | 4/2020 | Huang et al. |
| 10,630,010 B2 | 4/2020 | Tracy et al. |
| 10,651,606 B2 | 5/2020 | Little |
| 10,777,921 B2 | 9/2020 | Lu et al. |
| 10,797,417 B2 | 10/2020 | Scholeno et al. |
| 10,847,930 B2 | 11/2020 | Ayzenberg et al. |
| 10,862,240 B2 | 12/2020 | Bakshan et al. |
| 10,873,149 B2 | 12/2020 | Chen |
| 10,916,894 B2 | 2/2021 | Kirk et al. |
| 10,931,050 B2 | 2/2021 | Cohen |
| 10,944,189 B2 | 3/2021 | Xu et al. |
| 11,189,971 B2 | 11/2021 | Lu |
| 11,757,215 B2 | 9/2023 | Xu et al. |
| 2008/0246555 A1 | 10/2008 | Kirk et al. |
| 2008/0248658 A1 | 10/2008 | Cohen et al. |
| 2008/0248659 A1 | 10/2008 | Cohen et al. |
| 2008/0248660 A1 | 10/2008 | Kirk et al. |
| 2008/0318455 A1 | 12/2008 | Beaman et al. |
| 2008/0318476 A1 | 12/2008 | Weber et al. |
| 2009/0011620 A1 | 1/2009 | Avery et al. |
| 2009/0011641 A1 | 1/2009 | Cohen et al. |
| 2009/0011643 A1 | 1/2009 | Amleshi et al. |
| 2009/0011645 A1 | 1/2009 | Laurx et al. |
| 2009/0035955 A1 | 2/2009 | McNamara |
| 2009/0061661 A1 | 3/2009 | Shuey et al. |
| 2009/0117386 A1 | 5/2009 | Vacanti et al. |
| 2009/0149045 A1 | 6/2009 | Chen et al. |
| 2009/0203259 A1 | 8/2009 | Nguyen et al. |
| 2009/0239395 A1 | 9/2009 | Cohen et al. |
| 2009/0258516 A1 | 10/2009 | Hiew et al. |
| 2009/0291593 A1 | 11/2009 | Atkinson et al. |
| 2009/0305533 A1 | 12/2009 | Feldman et al. |
| 2009/0305553 A1 | 12/2009 | Thomas et al. |
| 2010/0018738 A1 | 1/2010 | Chen et al. |
| 2010/0048058 A1 | 2/2010 | Morgan et al. |
| 2010/0078738 A1 | 4/2010 | Chambers et al. |
| 2010/0081302 A1 | 4/2010 | Atkinson et al. |
| 2010/0099299 A1 | 4/2010 | Moriyama et al. |
| 2010/0144167 A1 | 6/2010 | Fedder et al. |
| 2010/0248544 A1 | 9/2010 | Xu et al. |
| 2010/0273359 A1 | 10/2010 | Walker et al. |
| 2010/0291806 A1 | 11/2010 | Minich et al. |
| 2010/0294530 A1 | 11/2010 | Atkinson et al. |
| 2011/0003509 A1 | 1/2011 | Gailus |
| 2011/0034075 A1 | 2/2011 | Feldman et al. |
| 2011/0067237 A1 | 3/2011 | Cohen et al. |
| 2011/0081114 A1 | 4/2011 | Togami |
| 2011/0104948 A1 | 5/2011 | Girard, Jr. et al. |
| 2011/0130038 A1 | 6/2011 | Cohen et al. |
| 2011/0212649 A1 | 9/2011 | Stokoe et al. |
| 2011/0212650 A1 | 9/2011 | Amleshi et al. |
| 2011/0230095 A1 | 9/2011 | Atkinson et al. |
| 2011/0230096 A1 | 9/2011 | Atkinson et al. |
| 2011/0256739 A1 | 10/2011 | Toshiyuki et al. |
| 2011/0287663 A1 | 11/2011 | Gailus et al. |
| 2012/0003848 A1 | 1/2012 | Casher et al. |
| 2012/0052712 A1 | 3/2012 | Wang |
| 2012/0058665 A1 | 3/2012 | Zerebilov |
| 2012/0077380 A1 | 3/2012 | Minich et al. |
| 2012/0094536 A1 | 4/2012 | Khilchenko et al. |
| 2012/0115371 A1 | 5/2012 | Chuang et al. |
| 2012/0156929 A1 | 6/2012 | Manter et al. |
| 2012/0164860 A1 | 6/2012 | Wang |
| 2012/0184154 A1 | 7/2012 | Frank et al. |
| 2012/0202363 A1 | 8/2012 | McNamara et al. |
| 2012/0202370 A1 | 8/2012 | Mulfinger et al. |
| 2012/0202386 A1 | 8/2012 | McNamara et al. |
| 2012/0202387 A1 | 8/2012 | McNamara |
| 2012/0214343 A1 | 8/2012 | Buck et al. |
| 2012/0214344 A1 | 8/2012 | Cohen et al. |
| 2013/0012038 A1 | 1/2013 | Kirk et al. |
| 2013/0017733 A1 | 1/2013 | Kirk et al. |
| 2013/0034999 A1 | 2/2013 | Szczesny et al. |
| 2013/0065454 A1 | 3/2013 | Milbrand, Jr. |
| 2013/0078870 A1 | 3/2013 | Milbrand, Jr. |
| 2013/0078871 A1 | 3/2013 | Milbrand, Jr. |
| 2013/0090001 A1 | 4/2013 | Kagotani |
| 2013/0109232 A1 | 5/2013 | Paniaqua |
| 2013/0143442 A1 | 6/2013 | Cohen et al. |
| 2013/0164970 A1 | 6/2013 | Regnier et al. |
| 2013/0196553 A1 | 8/2013 | Gailus |
| 2013/0217263 A1 | 8/2013 | Pan |
| 2013/0225006 A1 | 8/2013 | Khilchenko et al. |
| 2013/0273781 A1 | 10/2013 | Buck et al. |
| 2013/0288513 A1 | 10/2013 | Masubuchi et al. |
| 2013/0316590 A1 | 11/2013 | Hon |
| 2013/0340251 A1 | 12/2013 | Regnier et al. |
| 2014/0004724 A1 | 1/2014 | Cartier, Jr. et al. |
| 2014/0004726 A1 | 1/2014 | Cartier, Jr. et al. |
| 2014/0004746 A1 | 1/2014 | Cartier, Jr. et al. |
| 2014/0035755 A1 | 2/2014 | Ward |
| 2014/0057498 A1 | 2/2014 | Cohen |
| 2014/0154912 A1 | 6/2014 | Hirschy |
| 2014/0193993 A1 | 7/2014 | Meng |
| 2014/0273557 A1 | 9/2014 | Cartier, Jr. et al. |
| 2014/0273627 A1 | 9/2014 | Cartier, Jr. et al. |
| 2015/0056856 A1 | 2/2015 | Atkinson et al. |
| 2015/0072561 A1 | 3/2015 | Schmitt et al. |
| 2015/0093083 A1 | 4/2015 | Tsai et al. |
| 2015/0111427 A1 | 4/2015 | Wu et al. |
| 2015/0132990 A1 | 5/2015 | Nong Chou et al. |
| 2015/0236451 A1 | 8/2015 | Cartier, Jr. et al. |
| 2015/0236452 A1 | 8/2015 | Cartier, Jr. et al. |
| 2015/0255926 A1 | 9/2015 | Paniagua |
| 2015/0280368 A1 | 10/2015 | Bucher |
| 2015/0288110 A1 | 10/2015 | Tanguchi et al. |
| 2015/0380868 A1 | 12/2015 | Chen et al. |
| 2016/0000616 A1 | 1/2016 | Lavoie |
| 2016/0004022 A1 | 1/2016 | Ishii |
| 2016/0054527 A1 | 2/2016 | Tang et al. |
| 2016/0104990 A1 | 4/2016 | Laurx et al. |
| 2016/0131859 A1 | 5/2016 | Ishii et al. |
| 2016/0149343 A1 | 5/2016 | Atkinson et al. |
| 2016/0156133 A1 | 6/2016 | Masubuchi et al. |
| 2016/0172794 A1 | 6/2016 | Sparrowhawk et al. |
| 2016/0174412 A1 | 6/2016 | Karaaslan et al. |
| 2016/0211618 A1 | 7/2016 | Gailus |
| 2016/0211623 A1 | 7/2016 | Sharf et al. |
| 2016/0336692 A1 | 11/2016 | Champion et al. |
| 2017/0054234 A1 | 2/2017 | Kachlic |
| 2017/0077643 A1 | 3/2017 | Zbinden et al. |
| 2017/0285282 A1 | 10/2017 | Regnier et al. |
| 2018/0062323 A1 | 3/2018 | Kirk et al. |
| 2018/0089966 A1 | 3/2018 | Ward |
| 2018/0145438 A1 | 5/2018 | Cohen |
| 2018/0166828 A1 | 6/2018 | Gailus |
| 2018/0198220 A1 | 7/2018 | Sasame et al. |
| 2018/0212385 A1 | 7/2018 | Little |
| 2018/0219331 A1 | 8/2018 | Cartier, Jr. et al. |

(56) References Cited

U.S. PATENT DOCUMENTS

| 2018/0278000 A1 | 9/2018 | Regnier |
| 2018/0287280 A1 | 10/2018 | Ratkovic |
| 2018/0309214 A1 | 10/2018 | Lloyd et al. |
| 2019/0013617 A1 | 1/2019 | Ayzenberg et al. |
| 2019/0115677 A1 | 4/2019 | Kachlic |
| 2019/0181582 A1 | 6/2019 | Beltran et al. |
| 2019/0319395 A1 | 10/2019 | Bakshan et al. |
| 2019/0326703 A1 | 10/2019 | Chen |
| 2019/0334292 A1 | 10/2019 | Cartier, Jr. et al. |
| 2020/0021052 A1 | 1/2020 | Milbrand, Jr. et al. |
| 2020/0076132 A1 | 3/2020 | Yang et al. |
| 2020/0076455 A1 | 3/2020 | Sharf |
| 2020/0091637 A1 | 3/2020 | Scholeno et al. |
| 2020/0099149 A1 | 3/2020 | Xu et al. |
| 2020/0220289 A1 | 7/2020 | Scholeno et al. |
| 2020/0235529 A1 | 7/2020 | Kirk et al. |
| 2020/0244025 A1 | 7/2020 | Winey et al. |
| 2020/0259294 A1 | 8/2020 | Lu |
| 2020/0266584 A1 | 8/2020 | Lu |
| 2020/0266585 A1 | 8/2020 | Paniagua et al. |
| 2020/0274267 A1 | 8/2020 | Zerebilov |
| 2020/0274295 A1 | 8/2020 | Briant |
| 2021/0098927 A1 | 4/2021 | Si et al. |
| 2021/0159643 A1 | 5/2021 | Kirk et al. |
| 2021/0175670 A1 | 6/2021 | Cartier, Jr. et al. |
| 2021/0203096 A1 | 7/2021 | Cohen |
| 2021/0234314 A1 | 7/2021 | Johnescu et al. |
| 2021/0234315 A1 | 7/2021 | Ellison et al. |
| 2021/0242632 A1 | 8/2021 | Trout et al. |
| 2022/0052467 A1 | 2/2022 | Xu et al. |
| 2022/0094099 A1 | 3/2022 | Liu et al. |
| 2022/0102916 A1 | 3/2022 | Liu et al. |

FOREIGN PATENT DOCUMENTS

| CN | 201222548 Y | 4/2009 |
| CN | 201252183 Y | 6/2009 |
| CN | 101552410 A | 10/2009 |
| CN | 101600293 A | 12/2009 |
| CN | 201374433 Y | 12/2009 |
| CN | 101752700 A | 6/2010 |
| CN | 101790818 A | 7/2010 |
| CN | 101120490 B | 11/2010 |
| CN | 201690009 U | 12/2010 |
| CN | 101964463 A | 2/2011 |
| CN | 201846527 U | 5/2011 |
| CN | 102106041 A | 6/2011 |
| CN | 102106046 A | 6/2011 |
| CN | 102148462 A | 8/2011 |
| CN | 102195173 A | 9/2011 |
| CN | 102232259 A | 11/2011 |
| CN | 102239605 A | 11/2011 |
| CN | 102282731 A | 12/2011 |
| CN | 102292881 A | 12/2011 |
| CN | 101600293 B | 5/2012 |
| CN | 102570100 A | 7/2012 |
| CN | 102598430 A | 7/2012 |
| CN | 102738621 A | 10/2012 |
| CN | 102859805 A | 1/2013 |
| CN | 202695788 U | 1/2013 |
| CN | 202695861 U | 1/2013 |
| CN | 103036081 A | 4/2013 |
| CN | 103594871 A | 2/2014 |
| CN | 103969768 A | 8/2014 |
| CN | 204190038 U | 3/2015 |
| CN | 104577577 A | 4/2015 |
| CN | 205043936 U | 2/2016 |
| CN | 205212085 U | 5/2016 |
| CN | 102820589 B | 8/2016 |
| CN | 105826740 A | 8/2016 |
| CN | 106099546 A | 11/2016 |
| CN | 109994892 A | 7/2019 |
| CN | 111555069 A | 8/2020 |
| CN | 213636403 U | 7/2021 |
| EP | 2169770 A2 | 3/2010 |
| EP | 2388867 A2 | 11/2011 |
| EP | 2405537 A1 | 1/2012 |
| JP | 2009-043717 A | 2/2009 |
| JP | 2009-110956 A | 5/2009 |
| JP | 2010-266729 A | 11/2010 |
| JP | 1656986 S | 4/2020 |
| JP | 1668637 S | 9/2020 |
| JP | 1668730 S | 9/2020 |
| KR | 10-2015-0067010 A | 6/2015 |
| KR | 10-2015-0101020 A | 9/2015 |
| KR | 10-2016-0038192 A | 4/2016 |
| TW | M357771 U | 5/2009 |
| TW | 200926536 A | 6/2009 |
| TW | M403141 U | 5/2011 |
| TW | M494411 U | 1/2015 |
| TW | I475770 B | 3/2015 |
| TW | M518837 U | 3/2016 |
| WO | WO 2008/124052 A2 | 10/2008 |
| WO | WO 2008/124054 A2 | 10/2008 |
| WO | WO 2008/124057 A1 | 10/2008 |
| WO | WO 2008/124101 A2 | 10/2008 |
| WO | WO 2009/111283 A2 | 9/2009 |
| WO | WO 2010/030622 A1 | 3/2010 |
| WO | WO 2010/039188 A1 | 4/2010 |
| WO | WO 2011/100740 A2 | 8/2011 |
| WO | WO 2011/106572 A2 | 9/2011 |
| WO | WO 2011/139946 A1 | 11/2011 |
| WO | WO 2011/140438 A2 | 11/2011 |
| WO | WO 2011/140438 A3 | 12/2011 |
| WO | WO 2012/106554 A2 | 8/2012 |
| WO | WO 2013/059317 A1 | 4/2013 |
| WO | WO 2015/112717 A1 | 7/2015 |
| WO | WO 2016/008473 A1 | 1/2016 |
| WO | WO 2018/039164 A1 | 3/2018 |
| WO | WO 2021/070273 A1 | 4/2021 |

OTHER PUBLICATIONS

[No Author Listed], Common Management Interface Specification. Rev 4.0. MSA Group. May 8, 2019. 265 pages.
[No Author Listed], Electronics Connector Overview. FCI. Sep. 23, 2009. 78 pages.
[No Author Listed], EMI Shielding Compounds Instead of Metal. RTP Company. Last Accessed Apr. 3, 20210. 2 pages.
[No Author Listed], EMI Shielding Solutions and EMC Testing Services from Laird Technologies. Laird Technologies. Last accessed Apr. 30, 2021. 1 page.
[No Author Listed], FCI—High Speed Interconnect Solutions, Backpanel Connectors. FCI. [last accessed Apr. 30, 2021). 2 pages.
[No Author Listed], High Speed Backplane Connectors. Tyco Electronics. Product Catalog No. 1773095. Revised Dec. 1, 2008—40 pages.
[No Author Listed], HOZOX EMI Absorption Sheet and Tape. Molex. Laird Technologies. 2013. 2 pages.
[No Author Listed], INF-8628 Specification for QSFP-DD 8X Transceiver (QSFP Double Density) Rev 0.0 Jun. 27, 2016. SNIA SFF TWG Technology Affiliate. 1 page.
[No Author Listed], Molex Connectors as InfiniBand Solutions. Design World. Nov. 19, 2008. 7 pages. https://www.designworldonline.com/molex-connectors-as-infiniband-solutions/. [last accessed May 3, 2021].
[No Author Listed], OSFP MSA Specification for OSFP Octal Small Form Factor Pluggable Module. Revision 3.0 OSFP MSA. Mar. 14, 2020. 99 pages.
[No Author Listed], Photograph of Molex Connector. Oct. 2021. 1 page.
[No Author Listed], Photograph of TE Connector. Oct. 2021. 1 page.
[No Author Listed], Pluggable Input/Output Solutions. Tyco Electronics Catalog 1773408-1. Revised Feb. 2009. 40 pages.
[No Author Listed], QSFP-DD MSA QSFP-DD Hardware Specification for QSFP Double Density 8X Pluggable Transceiver. Revision 5.1. QSFP-DD MSA. Aug. 7, 2020. 84 pages.
[No Author Listed], QSFP-DD Specification for QSFP Double Density 8X Pluggable Transceiver Specification, Rev. 2.0. QSFP-DD MSA. Mar. 13, 2017. 106 pages.

(56) References Cited

OTHER PUBLICATIONS

[No Author Listed], RTP Company—EMI/RFI Shielding Compounds (Conductive) Data Sheets. RTP Company. Last accessed Apr. 30, 2021. 4 pages.

[No Author Listed], SFF Committee SFF-8436 Specification for QSFP+ 4X 10 Gb/s Pluggable Transceiver. Revision 4.9. SFF Committee. Aug. 31, 2018. 88 pages.

[No Author Listed], SFF Committee SFF-8665 Specification for QSFP+ 28 Gb/s 4X Pluggable Transceiver Solution (QSFP28). Revision 1.9. SFF Committee. Jun. 29, 2015. 14 pages.

[No Author Listed], SFF-8075 Specification for PCI Card Version of SFP Cage. Rev 1.0. SFF Committee. Jul. 3, 2001. 11 pages.

[No Author Listed], SFF-8431 Specifications for Enhanced Small Form Factor Pluggable Module SFP+. Revision 4.1. SFF Committee. Jul. 6, 2009. 132 pages.

[No Author Listed], SFF-8432 Specification for SFP+ Module and Cage. Rev 5.1. SFF Committee. Aug. 8, 2012. 18 pages.

[No Author Listed], SFF-8433 Specification for SFP+ Ganged Cage Footprints and Bezel Openings. Rev 0.7. SFF Committee. Jun. 5, 2009. 15 pages.

[No Author Listed], SFF-8477 Specification for Tunable XFP for ITU Frequency Grid Applications. Rev 1.4. SFF Committee. Dec. 4, 2009. 13 pages.

[No Author Listed], SFF-8663 Specification for QSFP+ 28 Gb/s Cage (Style A) Rev 1.7. Oct. 19, 2017. SNIA SFF TWG Technology Affiliate. 18 pages.

[No Author Listed], SFF-8672 Specification for QSFP+ 4x 28 Gb/s Connector (Style B). Revision 1.2. SNIA. Jun. 8, 2018. 21 pages.

[No Author Listed], SFF-8679 Specification for QSFP+ 4X Base Electrical Specification. Rev 1.7. SFF Committee. Aug. 12, 2014. 31 pages.

[No Author Listed], SFF-8682 Specification for QSFP+ 4X Connector. Rev 1.1. SNIA SFF TWG Technology Affiliate. Jun. 8, 2018. 19 pages.

[No Author Listed], Shielding Theory and Design. Laird Technologies. Last accessed Apr. 30, 2021. 1 page.

[No Author Listed], Shielding Theory and Design. Laird Technologies. Last accessed Apr. 30, 2021. 2 pages. URL:web.archive.org/web/20030226182710/http://www.lairdtech.com/catalog/staticdata/shieldingtheorydesign/std_3.htm.

[No Author Listed], Shielding Theory and Design. Laird Technologies. Last accessed Apr. 30, 2021. 2 pages. URL:web.archive.org/web/20021223144443/http://www.lairdtech.com/catalog/staticdata/shieldingtheorydesign/std_2.htm.

[No Author Listed], Typical conductive additives—Conductive Compounds. RTP Company. https://www.rtpcompany.com/products/conductive/additives.htm. Last accessed Apr. 30, 2021. 2 pages.

[No Author Listed], Z-Pack HM-Zd Connector, High Speed Backplane Connectors. Tyco Electronics. Catalog 1773095. 2009;5-44.

Atkinson et al., High Frequency Electrical Connector, U.S. Appl. No. 15/645,931, filed Jul. 10, 2017.

Decision Invalidating CN Patent Application No. 201610952606.4 dated Sep. 18, 2021, which issued as CN Utility Model Patent No. 107069274B, and Certified Translation.

Do et al., A Novel Concept Utilizing Conductive Polymers on Power Connectors During Hot Swapping in Live Modular Electronic Systems. IEEE Xplore 2005; downloaded Feb. 18, 2021;340-345.

In re Certain Electrical Connectors and Cages, Components Thereof, and Prods. Containing the Same, Inv. No. 337-TA-1241, Order No. 31 (Oct. 19, 2021): Construing Certain Terms of the Asserted Claims of the Patents at Issue.

In re Matter of Certain Electrical Connectors and Cages, Components Thereof, and Products Containing the Same, Inv. No. 337-TA-1241, Luxshare Respondents' Initial Post-Hearing Brief. Public Version. Nov. 23, 2021. 348 pages.

In re Matter of Certain Electrical Connectors and Cages, Components Thereof, and Products Containing the Same, Inv. No. 337-TA-1241, Luxshare Respondents' Reply Post-Hearing Brief. Public Version. Dec. 6, 2021. 165 pages.

In re Matter of Certain Electrical Connectors and Cages, Components Thereof, and Products Containing the Same, Inv. No. 337-TA-1241, Complainant Amphenol Corporation's Corrected Initial Post-Hearing Brief. Public Version. Jan. 5, 2022. 451 pages.

In re Matter of Certain Electrical Connectors and Cages, Components Thereof, and Products Containing the Same, Inv. No. 337-TA-1241, Complainant Amphenol Corporation's Post-Hearing Reply Brief. Public Version. Dec. 6, 2021. 159 pages.

In re Matter of Certain Electrical Connectors and Cages, Components Thereof, and Products Containing the Same, Inv. No. 337-TA-1241, Notice of Prior Art. Jun. 3, 2021. 319 pages.

In re Matter of Certain Electrical Connectors and Cages, Components Thereof, and Products Containing the Same, Inv. No. 337-TA-1241, Respondents' Pre-Hearing Brief. Redacted. Oct. 21, 2021. 219 pages.

Invalidity Claim Charts Based on CN 201112782Y ("Cai"). Luxshare Respondents' Supplemental Responses to Interrogatories Nos. 13 and 14, Exhibit 25. May 7, 2021. 147 pages.

Invalidity Claim Charts Based on U.S. Pat. No. 6,179,651 ("Huang"). Luxshare Respondents' Supplemental Responses to Interrogatories Nos. 13 and 14, Exhibit 26. May 7, 2021. 153 pages.

Invalidity Claim Charts Based on U.S. Pat. No. 7,261,591 ("Korsunsky"). Luxshare Respondents' Supplemental Responses to Interrogatories Nos. 13 and 14, Exhibit 27. May 7, 2021. 150 pages.

McAlexander, CV of Joseph C. McAlexander III . Exhibit 1009. 2021. 31 pages.

McAlexander, Declaration of Joseph C. McAlexander III in Support of Petition for Inter Partes Review of U.S. Pat. No. 10,381,767. Exhibit 1002. Nov. 4, 2021. 85 pages.

Palkert (ed), QSFP-DD Overview. Mar. 14, 2017. 19 pages. URL:http://www.qsfp-dd.com.

Petition for Inter Partes Review. *Luxshare Precision Industry Co., Ltd* v. *Amphenol Corp*. U.S. Pat. No. 10,381,767. IPR2022-00132. Nov. 4, 2021. 112 pages.

Silva et al., Conducting Materials Based on Epoxy/Graphene Nanoplatelet Composites With Microwave Absorbing Properties: Effect of the Processing Conditions and Ionic Liquid. Frontiers in Materials. Jul. 2019;6(156):1-9. doi: 10.3389/fmats.2019.00156.

Tracy, Rev. 3.0 Specification IP (Intellectual Property). Mar. 20, 2020. 8 pages.

* cited by examiner

HIGH SPEED ELECTRICAL CONNECTOR AND PRINTED CIRCUIT BOARD THEREOF

CROSS REFERENCE TO RELATED APPLICATIONS

This application is a continuation of U.S. patent application Ser. No. 17/195,403 (now U.S. Pat. No. 11,757,215), filed on Mar. 8, 2021, entitled "HIGH SPEED ELECTRICAL CONNECTOR AND PRINTED CIRCUIT BOARD THEREOF," which is a continuation of U.S. patent application Ser. No. 16/415,456 (now U.S. Pat. No. 10,944,189), filed on May 17, 2019, entitled "HIGH SPEED ELECTRICAL CONNECTOR AND PRINTED CIRCUIT BOARD THEREOF," which claims priority to and the benefit of Chinese Patent Application No. 201821577530.2, filed on Sep. 26, 2018. The entire contents of these applications are incorporated herein by reference in their entirety.

FIELD OF THE INVENTION

This disclosure relates generally to electronic systems and more specifically to electrical connectors able to carry high-frequency signals and printed circuit boards thereof.

BACKGROUND

Electrical connectors are used in many electronic systems. In general, various electronic devices (e.g., smart phones, tablet computers, desktop computers, notebook computers, digital cameras, and the like) have been provided with assorted types of connectors whose primary purpose is to enable an electronic device to exchange data, commands, and/or other signals with one or more other electronic devices. Electrical connectors are basic components needed to make some electrical systems functional. Signal transmission to transfer information (e.g., data, commands, and/or other electrical signals) often utilize electrical connectors between electronic devices, between components of an electronic device, and between electrical systems that may include multiple electronic devices.

It is generally easier and more cost effective to manufacture an electrical system as separate electronic assemblies, such as printed circuit boards ("PCBs"), which may be communicatively joined together with electrical connectors. In some scenarios, the PCBs to be joined may each have connectors mounted on them. The connectors may be mated together directly to interconnect the PCBs.

To facilitate manufacture of different parts of electronic devices in different places by different companies, aspects of the receptacle connectors and the plug connectors may be standardized, either through a formal standard-setting process or through adoption of a particular design by a large number of manufacturers. An example of an interconnection standard is the SAS or Serial Attached SCSI (Small Computer System Interface) standard. Another example is the SFP or Single Form-Factor Pluggable standard, as well as its variations: SFP+, QSFP, QSFP+, etc. Connectors made according to these pluggable standards are sometimes called I/O connectors, because they mate with plugs terminating cables that carry signals into or out of an electronic device. I/O connectors are commonly made with press fit terminal tails that make connections between the terminals in the connector and traces within a PCB when the terminal tails are pressed into holes in the PCB that pass through the traces.

I/O connectors according to these pluggable standards have one or more ports, each configured to receive a plug terminating a cable. It is sometimes desirable for there to be multiple ports in an electronic device, so that the device may communicate through cables with multiple other devices. The ports may be configured in rows and columns, and I/O connectors are sometimes made in a stacked configuration with 2 ports, one above the other. When multiple stacked connectors are mounted on a surface of a PCB, the ports are arrayed in rows and columns. Rows and columns of ports may also be made by mounting I/O connectors on opposite sides of the PCB, one above the other. This configuration is sometimes called "belly to belly."

For electronic devices that require a high-density, high-speed connector, techniques may be used to reduce interference between conductive elements within the connectors, and to provide other desirable electrical properties. One such technique involves the use of shield members between or around adjacent signal conductive elements of a connector system. The shields may prevent signals carried on one conductive element from creating "crosstalk" on another conductive element. The shields may also have an impact on an impedance of the conductive elements, which may further contribute to desirable electrical properties of the connector system.

Another technique that may be used to control performance characteristics of a connector entails transmitting signals differentially. Differential signals result from signals carried on a pair of conducting paths, called a "differential pair." The voltage difference between the conductive paths represents the differential signal. In general, a differential pair is designed with preferential coupling between the conducting paths of the pair. For example, the two conducting paths of a differential pair may be arranged to run closer to each other than to other adjacent signal paths in the connector.

SUMMARY

Aspects of the present application relate to a high speed electrical connector and an applicable printed circuit board thereof.

Some embodiments relate to an electrical connector. The electrical connector comprises a housing comprising a cavity and a first slot and a second slot extending into the cavity in a first direction, a first terminal subassembly comprising a first plurality of terminals held in a first row of terminals, a second terminal subassembly comprising a second plurality of terminals held in a second row of terminals, a third terminal subassembly comprising a third plurality of terminals held in a third row of terminals, and a fourth terminal subassembly comprising a fourth plurality of terminals held in a fourth row of terminals. Each of the first plurality of terminals, the second plurality of terminals, the third plurality of terminals, the fourth plurality of terminals comprises a mating portion, a tail and an intermediate portion joining the mating portion and the tail. The first terminal subassembly, the second terminal subassembly, the third terminal subassembly, and the fourth terminal subassembly are disposed within the cavity with the mating portions extending into a respective slot of the first slot and the second slot. The tails extend at a right angle from respective intermediate portions in four parallel rows in a plane parallel to the first direction.

In some embodiments, the tails in the four parallel rows are spaced, center to center, by 0.7 to 1 mm.

In some embodiments, the tails have a width of 0.25 mm.

In some embodiments, the housing further comprises at least two posts extending through and perpendicular to the plane.

In some embodiments, a plurality of anchor pins attached to the housing. Each anchor pin comprises a pair of opposing spring arms extending through and perpendicular to the plane.

In some embodiments, the tails of the first and fourth terminal subassemblies bend, with respect to intermediate portions of respective terminals, in the first direction. The tails of the second and third terminal subassemblies bend, with respect to intermediate portions of respective terminals, in a second direction opposite the first direction.

In some embodiments, the first terminal subassembly comprises a first row of tails of the four parallel rows. The second terminal subassembly comprises a second row of tails of the four parallel rows. The third terminal subassembly comprises a third row of tails of the four parallel rows. The fourth terminal subassembly comprises a fourth row of tails of the four parallel rows. The first row of tails is adjacent to and offset, in a direction perpendicular to the first direction, from the second row of tails. The third row of tails is adjacent to and offset, in a direction perpendicular to the first direction, from the fourth row of tails.

In some embodiments, the first terminal subassembly comprises a first insulative member holding the first plurality of terminals in the first row of terminals. The second terminal subassembly comprises a second insulative member holding the second plurality of terminals in the second row of terminals. The third terminal subassembly comprises a third insulative member holding the third plurality of terminals in the third row of terminals. The fourth terminal subassembly comprises a fourth insulative member holding the fourth plurality of terminals in the fourth row of terminals. The first insulative member abuts the second insulative member. The third insulative member abuts the fourth insulative member.

In some embodiments, the cavity of the housing is a first cavity. The first insulative member comprises a second cavity. The second insulative member comprises a third cavity. The first terminal subassembly and the second terminal subassembly are positioned with the second cavity aligned with the third cavity. The connector further comprises a ground member disposed in the second cavity and the third cavity, the ground member comprising projecting portions extending towards respective terminals in the first terminal subassembly and the second terminal subassembly.

In some embodiments, the ground member comprises a metal strip. The projecting portions of the ground member comprise spring fingers extending from the metal strip.

In some embodiments, the ground member is a composite lossy member comprising a strip of electrically lossy material. The metal strip is disposed within the strip of lossy material.

In some embodiments, the composite lossy member is a first composite lossy member of a plurality of composite lossy members disposed between the first terminal subassembly and the second terminal subassembly.

In some embodiments, the first insulative member comprises a first projection engaging the housing so as to block movement of the first terminal subassembly in the first direction and a second projection engaging the second insulative member so as to block movement of the second terminal subassembly in the first direction.

In some embodiments, the housing comprises an exterior face between the first slot and the second slot. The exterior face comprises a plurality of openings therethrough.

In some embodiments, the housing between the exterior face and the cavity comprises a lattice defined by walls bounding the plurality of openings.

In a further aspect, an electronic assembly comprises the electrical connector of any of the above mentioned embodiments, a printed circuit board comprising four parallel rows of pads on a surface thereof. The tails in each of the first row of tails, the second row of tails, the third row of tails, the fourth row of tails are soldered to respective pads of the four parallel rows of pads.

Some embodiments relate to an electrical connector. The electrical connector comprises a first plurality of terminals held in a first row, a second plurality of terminals held in a second row parallel to the first row, a third plurality of terminals held in a third row parallel to the first row, a fourth plurality of terminals held in a fourth row parallel to the first row, and a housing comprising a first slot and a second slot, each of the first and second slots extending in a direction parallel to the first row, the second row separated from the first slot in a direction perpendicular to the first row. The first plurality of terminals and the second plurality of terminals are disposed in the first slot. The third plurality of terminals and the fourth plurality of terminals are disposed in the second slot. Each of the first plurality of terminals, the second plurality of terminals, the third plurality of terminals, the fourth plurality of terminals comprises a mating portion, a tail and an intermediate portion joining the mating portion and the tail. Each intermediate portion comprises first and second parts extending in a right angle. The connector comprises a first ground member between the first parts of the intermediate portions of the first and second plurality of terminals, and a second ground member between the second parts of the intermediate portions of the first and second plurality of terminals.

In some embodiments, each of the first and second ground members comprises a strip of electrically lossy material.

In some embodiments, the first plurality of terminals comprise differential pairs of signal terminals separated by ground terminals. The ground terminals of the first plurality of terminals are electrically connected to each other through at least one of the first and second ground members.

In some embodiments, the second plurality of terminals comprise differential pairs of signal terminals separated by ground terminals. The ground terminals of the second plurality of terminals are electrically connected to the ground terminals of the first plurality of terminals through at least one of the first and second ground members.

In some embodiments, a third ground member between the first parts of the intermediate portions of the third and fourth plurality of terminals.

In some embodiments, the third plurality of terminals comprise differential pairs of signal terminals separated by ground terminals. The fourth plurality of terminals comprise differential pairs of signal terminals separated by ground terminals. The ground terminals of the third plurality of terminals are electrically connected to each other and to the ground terminals of the fourth plurality of terminals through the third ground members.

Some embodiments relate to a printed circuit board for receiving an electrical connector, the electrical connector having tails of four parallel rows of terminals extending at a right angle from respective intermediate portions of the four parallel rows of terminals. The printed circuit board comprises a first plurality of solder pads on a first surface of the printed circuit board, the first plurality of solder pads configured to receive a first row of tails of the four parallel rows; a second plurality of solder pads on the first surface, the second plurality of solder pads configured to receive a second row of tails of the four parallel rows; a third plurality of solder pads on the first surface, the third plurality of solder pads configured to receive a third row of tails of the four parallel rows; a fourth plurality of solder pads on the first surface, and the fourth plurality of solder pads configured to receive a fourth row of tails of the four parallel rows. The second plurality of solder pads are adjacent to and offset, in a first direction perpendicular to a second direction that the four parallel rows extend, from the first plurality of solder pads. The fourth plurality of solder pads are adjacent to and offset, in the first direction, from the third plurality of solder pads in the direction. The first plurality of solder pads and the third plurality of solder pads are aligned in the first direction.

In some embodiments, the solder pads of each of the first plurality of solder pad, the second plurality of solder pads, the third plurality of solder pads, and the fourth plurality of solder pads are spaced, center to center, by 0.7 to 1 mm.

In some embodiments, the solder pads have a width greater than respective tails' width.

In some embodiments, the printed circuit board comprises a fifth plurality of solder pads on a second surface of the printed circuit board, the second surface opposite the first surface, the fifth plurality of solder pads aligned to the first row and offset from the first plurality of solder pads; a sixth plurality of solder pads on the second surface, the sixth plurality of solder pads aligned to the second row and offset from the second plurality of solder pads; a seventh plurality of solder pads on the second surface, the seventh plurality of solder pads aligned to the third row and offset from the third plurality of solder pads; and an eighth plurality of solder pads on the second surface, the eighth plurality of solder pads aligned to the fourth row and offset from the fourth plurality of solder pads.

In some embodiments, the printed circuit board comprises first and second through-holes on a first side of the first plurality of solder pad, the second plurality of solder pads, the third plurality of solder pads, and the fourth plurality of solder pads; and third and fourth through-holes on a second side of the first plurality of solder pad, the second plurality of solder pads, the third plurality of solder pads, and the fourth plurality of solder pads, the second side opposite the first side. The first, second, third, and fourth through-holes are configured to receive anchor pins of the connector.

In some embodiments, the first, second, third, and fourth through-holes are not greater in size than the anchor pins of the connector.

In some embodiments, the printed circuit board comprises two locating holes configured to receive respective posts extending from a housing of the connector.

In some embodiments, the two locating holes are greater in size than the posts from the housing of the connector.

The foregoing features may be used, separately or together in any combination, in any of the embodiments discussed herein.

BRIEF DESCRIPTION OF DRAWINGS

Various aspects and embodiments of the present technology disclosed herein are described below with reference to the accompanying figures. It should be appreciated that the figures are not necessarily drawn to scale. Items appearing in multiple figures may be indicated by the same reference numeral. For the purposes of clarity, not every component may be labeled in every figure.

DETAILED DESCRIPTION

Figure 1:
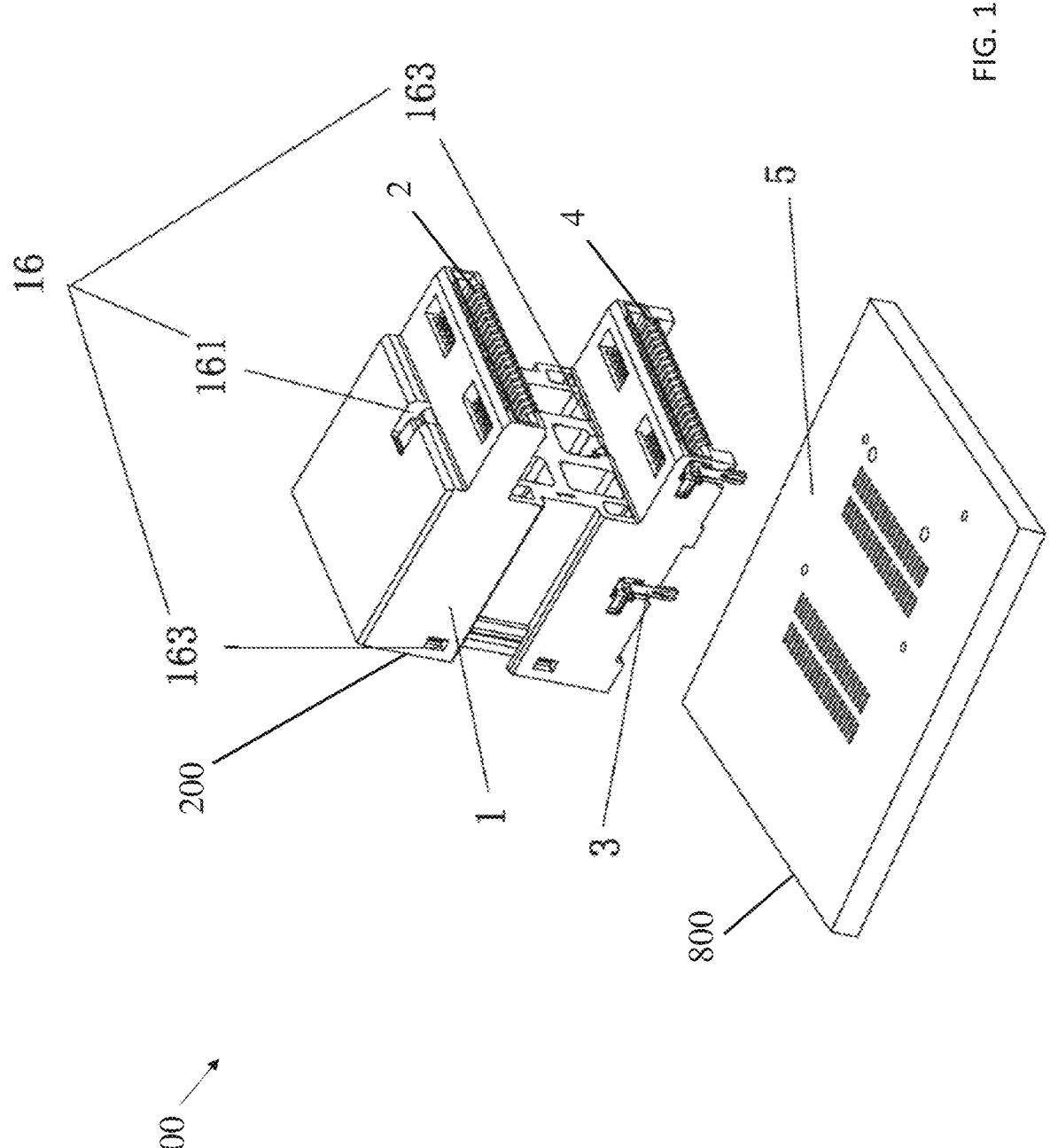
FIG. 1 is a perspective view of an exemplary embodiment of a connector and a printed circuit board configured to receive the connector.

The inventors have recognized and appreciated advantages and techniques for making stacked I/O connectors that are suitable for surface mounting. For example, the inventors have recognized and appreciated that stacked I/O connectors configured for surface mounting may reduce manufacturing defects of devices using those connectors and/or may provide better signal integrity in operation. In contrast to surface mount, connectors with press-fit terminal tails require printed circuit boards (PCBs) including holes configured to receive the press-fit terminal tails. When connectors are mounted to the PCBs, the press-fit pins tend to bend and scratch the plating on the PCBs, which creates manufacturing defects or reduces signal integrity in operation.

Further, the inventors have recognized and appreciated designs for high-speed I/O connectors that facilitate mounting I/O connectors on both the front and back sides of the PCBs, including one above the other in a belly to belly configuration. A large number of holes in the PCB may be required to receive high-speed connectors on both sides, particularly for stacked connector, which increases the difficulty in manufacturing these PCB s and in routing traces within the PCB. The inventors have recognized and appreciated that these difficulties are exacerbated for I/O connectors using press-fit terminal tails, as is conventional, because the holes required for press fit terminals must be sufficiently large to receive the press-fit terminal tails. Making press-fit tails smaller, so that the holes smaller, can increase the risk that the terminal tails will be damaged when the connector is pressed onto the PCB.

The inventors have recognized and appreciated that with surface mountable tails, deformation of the terminal tails and/or scratches on the PCB may be avoided when the connector is mounted to the PCB. Moreover, the holes in the PCB required to make connections between traces in the PCB and surface mount pads can be made smaller than holes that receive press-fit tails, increasing the density of the connector and/or facilitating belly to belly mounting of I/O connectors. Belly to belly mounting may be further facilitated by offsetting rows of terminal tails with respect to each other such that, when I/O connectors with similar footprints are mounted on opposite sides of the PCB, the vias for each connector are offset with respect to each other. The offset configuration may enable the vias making connections to each connector to fit within the same area of the PCB. Such an offset configuration may be simply created as a result of terminal subassemblies, each with a row of terminals.

The PCB may include solder pads on a single surface or both surfaces. The solder pads may be configured for the tails of the connector to be attached to them, such as through a reflow solder operation. As a result, the connector has high density and high speed, requires, requires a smaller mounting area on a PCB, relaxes the limitations in routing PCB traces, and reduces the electrical performance deterioration caused by PCB trace routing limitations.

The inventors have recognized features for an I/O connector, including a stacked I/O connector, to support a robust electronic system when using I/O connectors that are surface mounted to a PCB. The housing of a stacked I/O connector, for example, may be made with openings between ports in combination with terminal subassemblies that enable air flow so as to avoid deformation during a surface mount solder operation. Alternatively or additionally, the I/O connector may have one or more structures that reduce the risk of damage to solder joints when a plug is inserted into the stacked I/O connector or the connectors otherwise stressed during operation.

FIG. 1 shows an electrical assembly 100, including a connector 200 and a printed circuit board 800 configured to receive the connector 200. The connector 200 may include a housing 1, a first signal transmitting portion 2, anchor pins 3, and a second signal transmitting portion 4. The first signal transmitting portion 2, the second signal transmitting portion 4, and the anchor pins 3 may be held together by the housing 1. The housing 1 may be made from a liquid crystal polymer (LCP) and the anchor pins 3 may be made by stamping a copper alloy.

Figure 2:
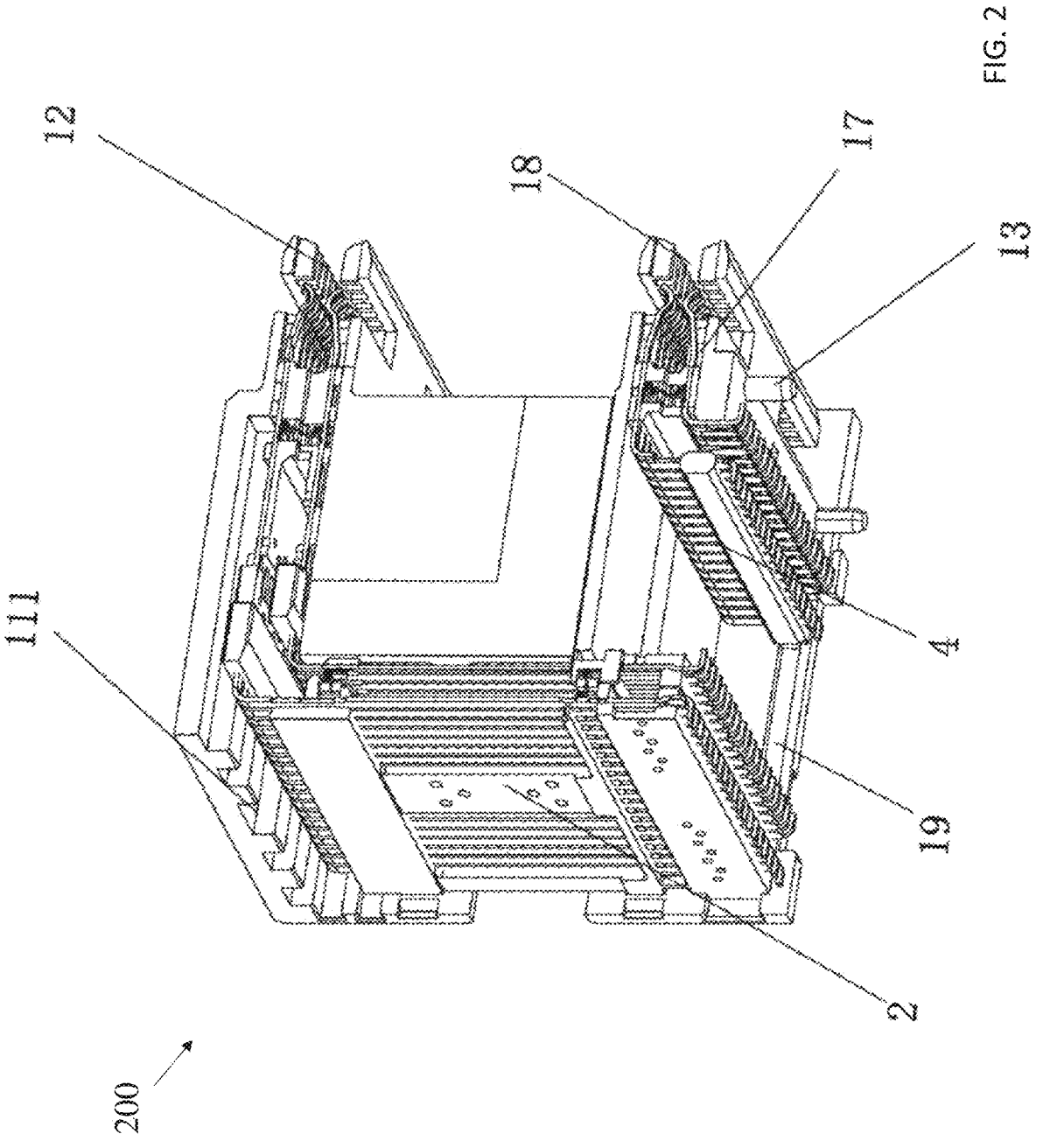
FIG. 2 is a perspective view of the connector of FIG. 1, with a side wall of the housing cut away, illustrating parts of the connector.
Figure 3:
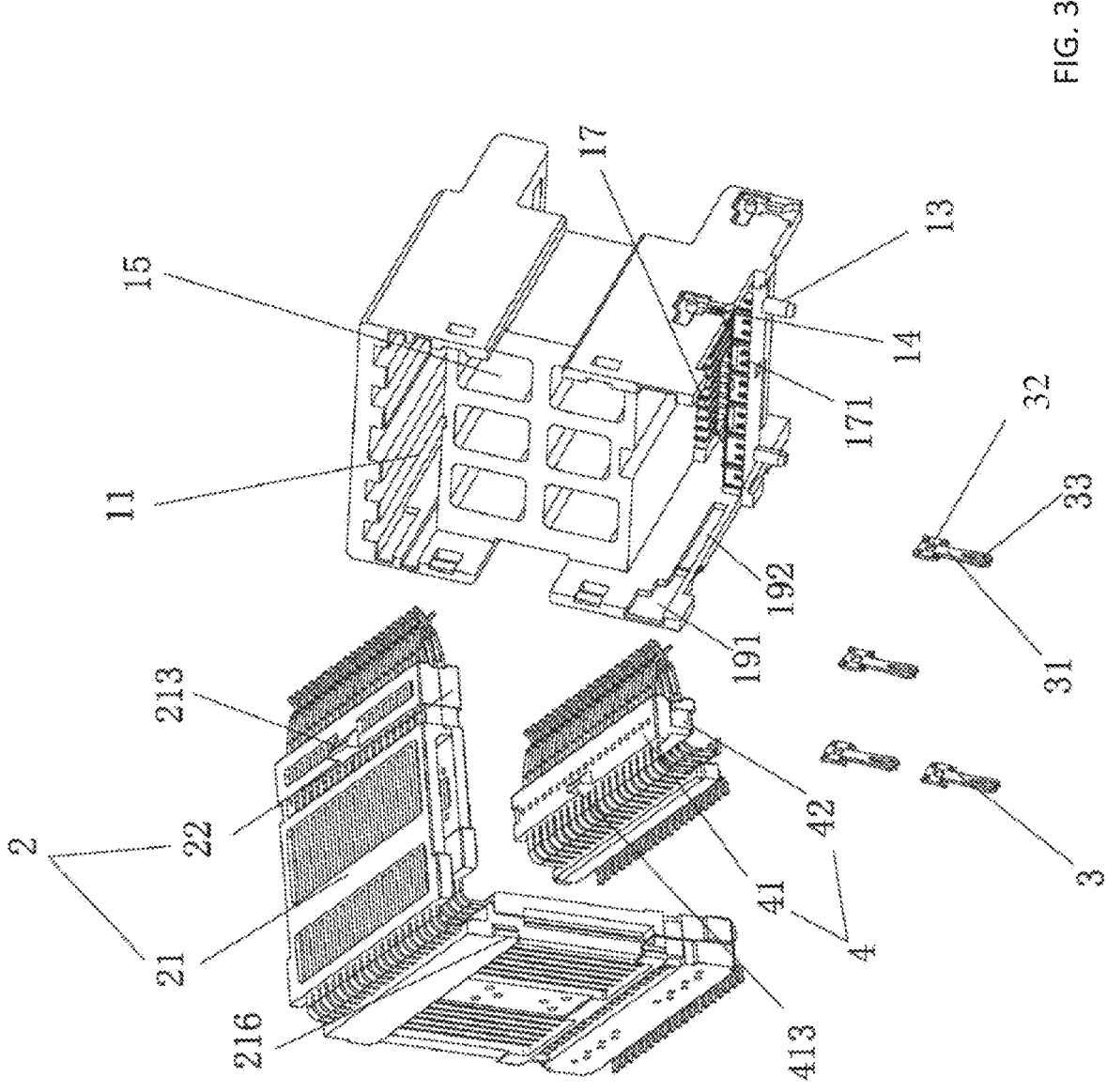
FIG. 3 is an exploded view of the connector of FIG. 1.

FIG. 2 shows a perspective view of the connector 200, with a side wall of the housing 1 cut away. FIG. 3 is an exploded view of the connector of FIG. 1. The first and second signal transmitting portions 2 and 4 may be arranged as row-oriented arrays, including a plurality of row terminal subassemblies disposed one above the other in a direction perpendicular to a surface of the PCB 800.

Each row terminal subassembly may include a mating interface configured to receive, for example, a card, a mounting interface configured to, for example, mount to a PCB, and a body extending between the mating interface and the mount interface. The body may include a first part connected to the mating interface, and a second part connected to the mounting interface. The first and second parts may extend in a right angle such that a card inserted in one of the signal transmitting portions 2 and 4 extends parallel to a PCB that the connector is mounted to.

In the illustrated example, the first signal transmitting portion 2 includes a first upper row terminal subassembly 21 and a first lower row terminal subassembly 22. The second signal transmitting portion 4 includes a second upper row terminal subassembly 41 and a second lower row terminal subassembly 42. The first upper row terminal subassembly 21 and the first lower row terminal subassembly 22 may be held together in an upper installation slot 11 by the housing 1. The second upper row terminal subassembly 41 and the second lower row terminal subassembly 42 may be held together in a lower installation slot 17 by the housing 1.

Additionally or alternatively, the first upper row terminal subassembly 21 and the first lower row terminal subassembly 22 may be held together before being assembled into the housing 1. The second upper row terminal subassembly 41 and the second lower row terminal subassembly 42 may be held together before being assembled into the housing 1. The first and second upper and lower row terminal subassemblies may include attachment features, or otherwise be attached to one another in some embodiments.

The housing 1 may include the upper installation slot 11 and the lower installation slot 17, insertion slots 12 and 18, recesses 14, 16 and 19, posts 13, and openings 15. The installation slots 11 and 17 may be inside the housing 1. The upper installation slot 11 may extend a shorter length then the lower installation slot 17 such that the mounting interfaces of the first signal transmitting portion 2 and the mounting interfaces of the second signal transmitting portion 4 are offset in a direction perpendicular to a row direction that a row terminal extends. The installation slots 11 and 17 may be bounded by insulative material, such as housing 1, with grooves 111 and 171. The grooves may be positioned to remove insulative material along signal terminals so as to change the effective dielectric constant of material surrounding the signal conductors, which can adjust impedance of those signal terminals.

The insertion slots 12 and 18 may be arranged on the front side of the housing 1. The mating interface of the first signal transmitting portion 2 including, for example, mating portions 2113, 2213 (FIG. 6), may be held in the insertion slot 12. The mating interface of the second signal transmitting portion 4 including, for example, mating portions 4113, 4213 (FIG. 6), may be held in the insertion slot 18. The mating portions may be positioned in this way to make contact with pads on a paddle card of a plug inserted into the insertion slots 12 and 18.

Features, for example, recesses 14 in housing 1, may retain anchor pins 3. The anchor pins 3 each may include a body 31, a mounting hole 32, and spring arms 33. The mounting hole 32 may be located above the terminal body 31. The two spring arms 33 may extend from the terminal body 31 and towards opposite directions. The outside size of the swinging arms 33 may be 1.1 mm. After being soldered to a PCB, the anchor pins 3 may fix the connector to the PCB. Anchor pins 3 may also prevent the connector from floating during surface mounted technology (SMT) soldering of the first signal transmitting portion 2 and the second signal transmitting portion 4 of the connector to the PCB, thus avoiding dry joints.

The recesses 16 and 19 in surfaces of the housing 1 are configured to receive matching structures from the first signal transmitting portion 2 and the second signal transmitting portion 4, holding the signal transmitting portions in hosing 1. In the illustrated example, four anchor pins 3 each is held in a respective recess 14. The four recesses 14 are asymmetrically distributed on the two sides of the housing 1. The recesses 16 includes top recesses 161 and side recesses 162 and 163. The recesses 19 may include recesses 191 and 192.

The openings 15 may be arranged between the installation slots 11 and 17. The openings 15 may extend through surfaces of the housing 1 and substantially parallel to installation slots 11 and 17. The openings 15 may reduce the weight of the housing 1, and may also facilitate ventilation and heat dissipation during a surface mount solder operation. In the illustrated example, the housing 1 includes a lattice defined by walls bounding a plurality of openings 15.

In the illustrated embodiment, airflow through the openings may be enabled by the row-oriented terminal subassemblies in which each subassembly, such as first upper row terminal subassembly 21 and a first lower row terminal subassembly 22, has a row of terminals with space between the terminals. The insulative members holding the row of terminals together covers only a portion of the length of the intermediate portions of the terminals. As a result, air flow through openings 15 and around the terminals—allowing flow from front to back of the receptacle connector.

The posts 13 may extend from the bottom of the housing 1. The housing 1 may include at least two posts 13 such that the connector 200 may be first aligned to a footprint on a PCB (e.g., PCB 800) though the posts 13. After inserting the posts 13 into matching holes in the PCB, the solders pins may be aligned to respective solder pads on the PCB before being soldered to the pads. The posts 13 may have a the diameter of 1.0 mm.

Figure 4:
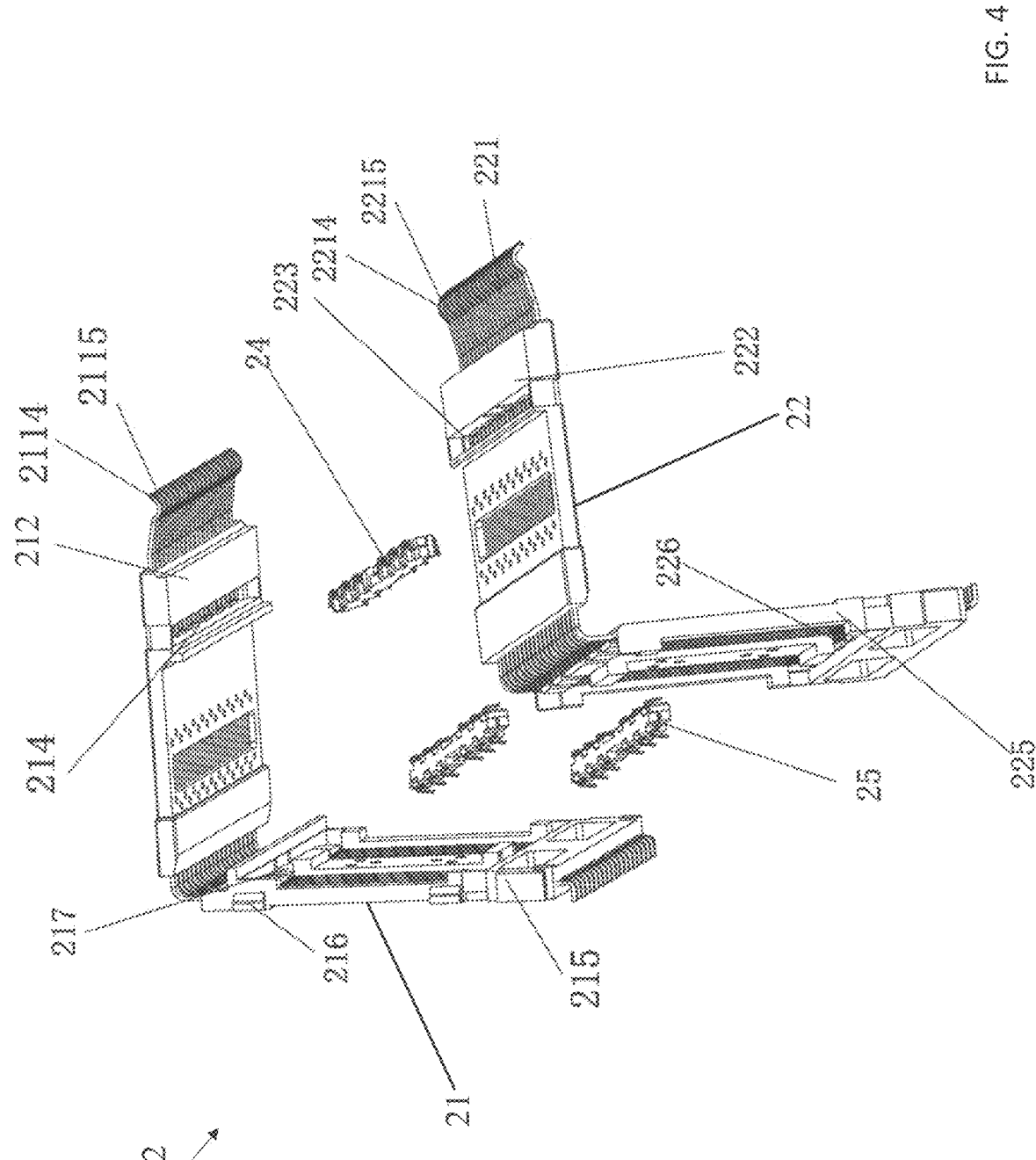
FIG. 4 is an exploded view of the first signal transmitting portion of FIG. 1.
Figure 5:
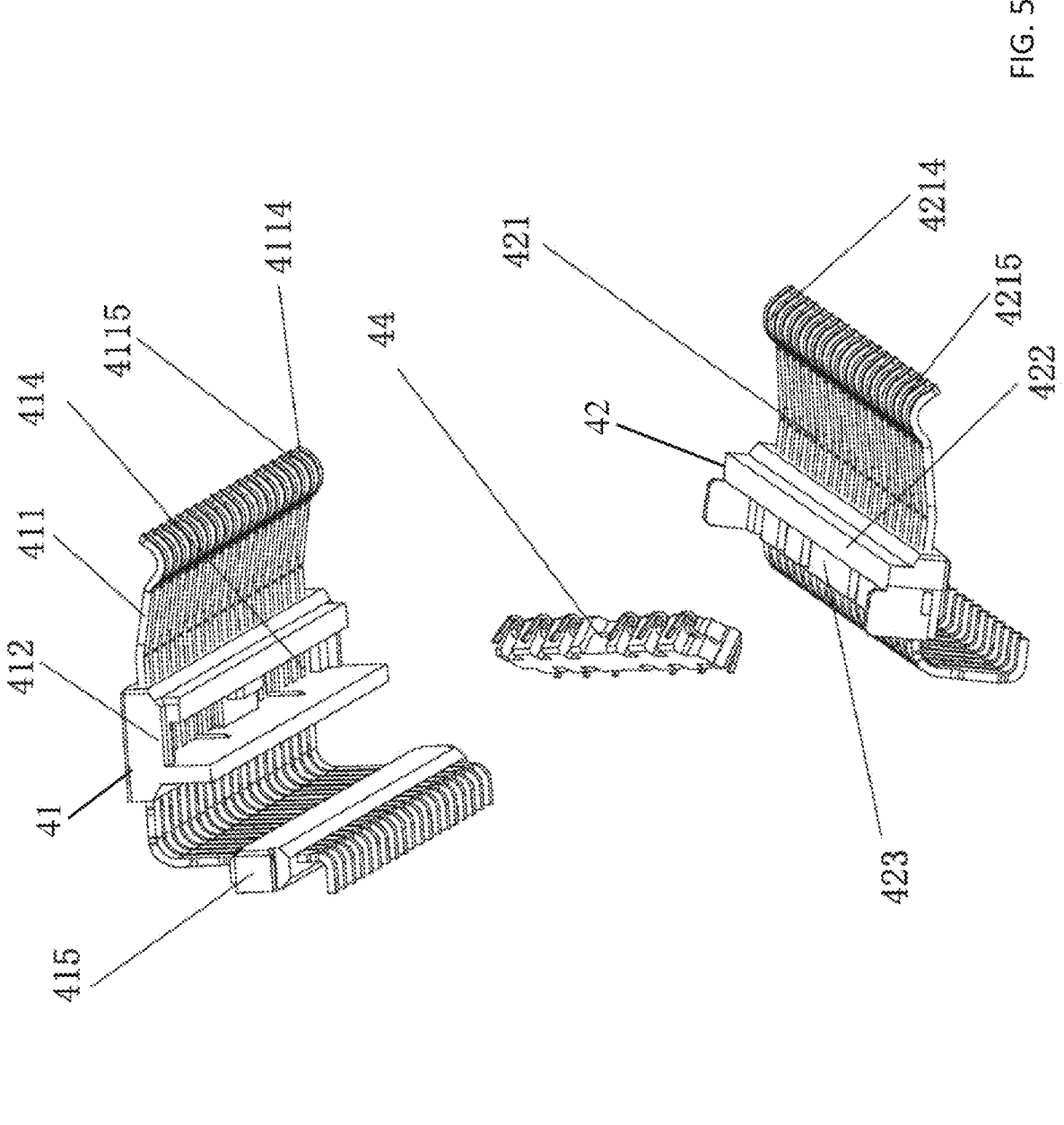
FIG. 5 is an exploded view of the second signal transmitting portion of FIG. 1.
Figure 6:
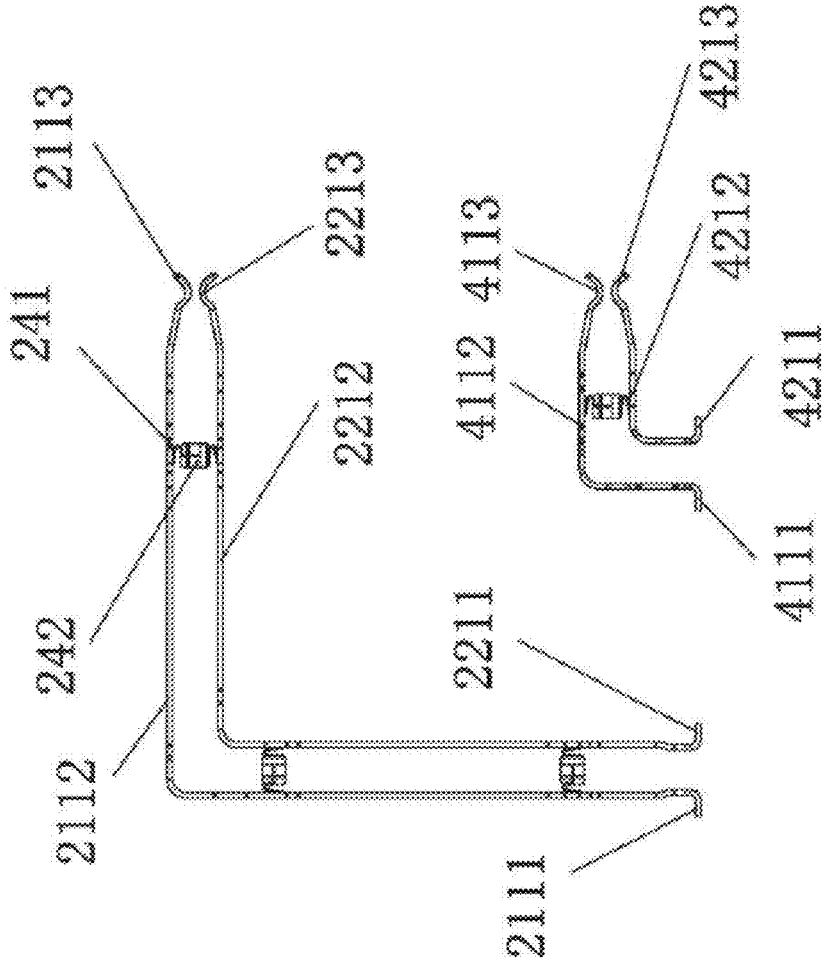
FIG. 6 is a side view of partial structures of the first signal transmitting portion of FIG. 4 and the second signal transmitting portion of FIG. 5, with insulative members cut away.
Figure 7:
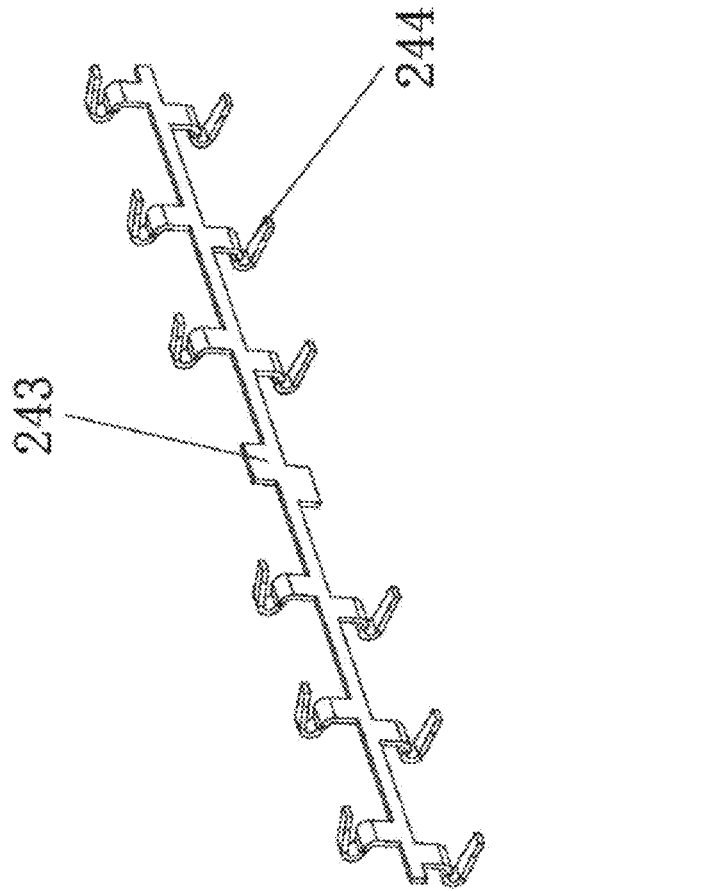
FIG. 7 is a perspective view of a metal strip of a ground member of the connector of FIG. 1.

FIG. 4 is an exploded view of the first signal transmitting portion 2. FIG. 5 is an exploded view of the second signal transmitting portion 4. FIG. 6 is a side view of partial structures of the first signal transmitting portion 2 and the second signal transmitting portion 4, with insulative members cut away. FIG. 7 is a perspective view of a metal strip of a ground member of the connector 200.

The first signal transmitting portion 2 may include the first upper row terminal subassembly 21, the first lower row terminal subassembly 22, and plurality of ground members, of which ground members 24 and 25 are numbered. The ground members 24 and 25 may be assembled between the first terminal subassembly 21 and the second terminal subassembly 22, with spring arms 244 close to or pressing against ground terminals in the terminal subassemblies.

The first terminal subassembly 21 may include a plurality of upper row terminals 211, insulative member 212, and insulative member 215. The insulative member 212 and insulative member 215 may be plastics molded over the plurality of upper row terminals 211. The insulative members 212 and 215 may include projections configured to be inserted into the recesses 16, and 19 of the housing 1 such that the first terminal subassembly 21 is fixedly held in the housing 1. In the illustrated example, the insulative member 212 includes projection 213 (FIG. 3) configured to be inserted into recess 161, two projections 216 arranged on two sides of the insulative member 215 configured to be inserted into recesses 163.

The second terminal subassembly 22 may include a plurality of lower row terminals 221, insulative member 222, and insulative member 225. The insulative member 222 and insulative member 225 may be plastic molded over the plurality of lower row terminals 222. The insulative member 212 and insulative member 222 may be assembled together. The insulative member 215 and insulative member 225 may be assembled together. The insulative member 215 and insulative member 225 may be confined in recess 191 of housing 1.

The plurality of upper row terminals 211 each may include solder pin 2111, intermediate portion 2112, and mating portion 2113 that extends between the solder pin 2111 and the mating portion 2113. The solder pins 2111 extend in a right angle from the intermediate portions 2112, and may serve as solder mount terminal tails. The plurality of upper row terminals 211 may include differential pairs of signals terminals separated by ground terminals.

In the illustrated example, the plurality of upper row terminals 211 include nineteen terminals disposed horizontally. The plurality of upper row terminals 211 include ground terminals 2114 and signal terminals 2115. The ground terminals 2114 and signal terminals 2115 are arranged at intervals. The first, fourth, seventh, thirteenth, sixteenth and nineteenth (counted from left to right) of the upper row terminals 211 are ground terminals 2114 and the others are signal terminals 2115. The center-to-center distance between the adjacent upper row terminals 211 may be 0.8 mm.

The plurality of lower row terminals 221 may include solder pin 2211, intermediate portion 2212, and mating portion 2213 that extends between the solder pin 2211 and the mating portion 2213. The solder pins 2211 extend in a right angle from the intermediate portions 2212, and opposite to a direction that solder pins 2111 extend. The solder pins 2211 may also serve as solder mount terminal tails. The plurality of lower row terminals 221 may include differential pairs of signals terminals separated by ground terminals.

In the illustrated example, the plurality of lower row terminals 221 include nineteen terminals disposed horizontally. The lower row terminals 221 include ground terminals 2214 and signal terminals 2215. The ground terminals 2214 and signal terminals 2215 are arranged at intervals. The first, fourth, seventh, thirteenth, sixteenth and nineteenth (counted from left to right) of the lower row terminals 221 are ground terminals 2214 and the others are signal terminals 2215. The central distance between the adjacent lower row terminals 221 may be 0.8 mm.

The upper row terminals 211 and lower row terminals 221 may be made by stamping a copper alloy. The width of the first solder pin 2111 and second solder pin 2211 may be 0.25 mm. The ground member 24 may electrically connect a plurality of ground terminals 2114 and ground terminals 2214, which may reduce the insertion loss and crosstalk interference during signal transmission.

The insulative member 212 of the first terminal subassembly 21 may include a mounting area 214. The insulative member 222 of the second terminal subassembly 22 may include a mounting area 223. The ground member 24 may be fit in the mounting areas 214 and 223, and between the first terminal subassembly 21 and the second terminal subassembly 22.

The first terminal subassembly 21 and second terminal subassembly 22 may include additional ground members in between, for example, ground members 25. The insulative member 215 of the first terminal subassembly may include additional mounting areas, for example, mounting areas 217. The insulative member 225 of the second terminal subassembly 22 may include additional mounting areas, for example, mounting area 226. The ground member 25 may be fit in the mounting areas 217 and 226. The ground member 25 may provide electrical connections between the plurality of ground terminals 2114 and ground terminals 2214, which may further reduce the insertion loss and crosstalk interference during signal transmission.

The ground members 24 and 25 may be made with metal and/or lossy portions. The ground members may have projections extending towards, and in some embodiments, contacting, the ground terminals.

In the illustrated example, the ground members 24 and 25 each includes a metal stripe 241 and a stripe of lossy material 242 molded over the metal stripe 241. The metal stripe 241 includes a body 243 and six spring arms 244 extending from the body 243. The spring arms 244 contact ground terminals 2114 and ground terminal 2214.

Any suitable lossy material may be used for these and other structures that are "lossy." Materials that conduct, but with some loss, or material which by another physical mechanism absorbs electromagnetic energy over the frequency range of interest are referred to herein generally as "lossy" materials. Electrically lossy materials can be formed from lossy dielectric and/or poorly conductive and/or lossy magnetic materials. Magnetically lossy material can be formed, for example, from materials traditionally regarded as ferromagnetic materials, such as those that have a magnetic loss tangent greater than approximately 0.05 in the frequency range of interest. The "magnetic loss tangent" is the ratio of the imaginary part to the real part of the complex electrical permeability of the material. Practical lossy magnetic materials or mixtures containing lossy magnetic materials may also exhibit useful amounts of dielectric loss or conductive loss effects over portions of the frequency range of interest. Electrically lossy material can be formed from material traditionally regarded as dielectric materials, such as those that have an electric loss tangent greater than approximately 0.05 in the frequency range of interest. The "electric loss tangent" is the ratio of the imaginary part to the real part of the complex electrical permittivity of the material. Electrically lossy materials can also be formed from materials that are generally thought of as conductors, but are either relatively poor conductors over the frequency range of interest, contain conductive particles or regions that are sufficiently dispersed that they do not provide high conductivity or otherwise are prepared with properties that lead to a relatively weak bulk conductivity compared to a good conductor such as copper over the frequency range of interest.

Electrically lossy materials typically have a bulk conductivity of about 1 Siemen/meter to about 10,000 Siemens/meter and preferably about 1 Siemen/meter to about 5,000 Siemens/meter. In some embodiments material with a bulk conductivity of between about 10 Siemens/meter and about 200 Siemens/meter may be used. As a specific example, material with a conductivity of about 50 Siemens/meter may be used. However, it should be appreciated that the conductivity of the material may be selected empirically or through electrical simulation using known simulation tools to determine a suitable conductivity that provides a suitably low crosstalk with a suitably low signal path attenuation or insertion loss.

Electrically lossy materials may be partially conductive materials, such as those that have a surface resistivity between 1 Ω/square and 100,000 Ω/square. In some embodiments, the electrically lossy material has a surface resistivity between 10 Ω/square and 1000 Ω/square. As a specific example, the material may have a surface resistivity of between about 20 Ω/square and 80 Ω/square.

In some embodiments, electrically lossy material is formed by adding to a binder a filler that contains conductive particles. In such an embodiment, a lossy member may be formed by molding or otherwise shaping the binder with filler into a desired form. Examples of conductive particles that may be used as a filler to form an electrically lossy material include carbon or graphite formed as fibers, flakes, nanoparticles, or other types of particles. Metal in the form of powder, flakes, fibers or other particles may also be used to provide suitable electrically lossy properties. Alternatively, combinations of fillers may be used. For example, metal plated carbon particles may be used. Silver and nickel are suitable metal plating for fibers. Coated particles may be used alone or in combination with other fillers, such as carbon flake. The binder or matrix may be any material that will set, cure, or can otherwise be used to position the filler material. In some embodiments, the binder may be a thermoplastic material traditionally used in the manufacture of electrical connectors to facilitate the molding of the electrically lossy material into the desired shapes and locations as part of the manufacture of the electrical connector. Examples of such materials include liquid crystal polymer (LCP) and nylon. However, many alternative forms of binder materials may be used. Curable materials, such as epoxies, may serve as a binder. Alternatively, materials such as thermosetting resins or adhesives may be used.

Also, while the above described binder materials may be used to create an electrically lossy material by forming a binder around conducting particle fillers, the invention is not so limited. For example, conducting particles may be impregnated into a formed matrix material or may be coated onto a formed matrix material, such as by applying a conductive coating to a plastic component or a metal component. As used herein, the term "binder" encompasses a material that encapsulates the filler, is impregnated with the filler or otherwise serves as a substrate to hold the filler.

Preferably, the fillers will be present in a sufficient volume percentage to allow conducting paths to be created from particle to particle. For example, when metal fiber is used, the fiber may be present in about 3% to 40% by volume. The amount of filler may impact the conducting properties of the material.

Filled materials may be purchased commercially, such as materials sold under the trade name Celestran® by Celanese Corporation which can be filled with carbon fibers or stainless steel filaments. A lossy material, such as lossy conductive carbon filled adhesive preform, such as those sold by Techfilm of Billerica, Massachusetts, US may also be used. This preform can include an epoxy binder filled with carbon fibers and/or other carbon particles. The binder surrounds carbon particles, which act as a reinforcement for the preform. In some embodiments, the preform may adhere to a metal member through the adhesive in the preform, which may be cured in a heat treating process. In some embodiments, the adhesive may take the form of a separate conductive or non-conductive adhesive layer.

Various forms of reinforcing fiber, in woven or non-woven form, coated or non-coated may be used. Non-woven carbon fiber is one suitable material. Other suitable materials, such as custom blends as sold by RTP Company, can be employed, as the present invention is not limited in this respect.

The second signal transmitting portion 4 may include a second upper row terminal subassembly 41, a second lower row terminal subassembly 42, and a ground member 44.

a second ground member 44, the second ground member 44 is assembly-connected with the second upper row terminal subassembly 41 and the second lower row terminal subassembly 42, and the second upper row terminal subassembly 41 is assembly-connected with the second lower row terminal subassembly 42.

The second upper row terminal subassembly 41 may include a plurality of upper row terminals 411, insulative member 412 and insulative member 415, which may be molded over the upper row terminals 411. The insulative member 412 may include projection 413. The insulative member 412 may include mounting area 414. The insulative member 415 may be confined in locating slot 192 of the housing 1.

The second lower row terminal subassembly 42 may include a plurality of lower row terminals 421 and insulative member 422, which may be molded over the lower row terminals 421. The insulative member 412 and insulative member 422 may be assembled together through the installation slot 17 of the housing 1. The insulative member 422 may include mounting area 423. The ground member 44 may fit in the mounting area 414 and mounting area 423 between the second upper row terminal subassembly 41 and the second lower row terminal subassembly 42. The ground member 44 may be structurally the same as the ground member 24.

In the illustrated example, each upper row terminal 411 comprises solder pin 4111, intermediate portion 4112 and mating portion 4113 connected in series. In the illustrated embodiment, there are nineteen upper row terminal 411 in a row. The upper row terminals 411 may be ground terminals 4114 or signal terminals 4115. The terminal 4114 and terminal 4115 are arranged at intervals, such as in a repeating pattern of a pair of signal terminals followed by a ground terminal. Each lower row terminal 421 comprises solder pin 4211, connecting body 4212 and mating portion 4213 in series. There are nineteen lower row terminal 421 in a row. The lower row terminals 421 may be ground terminals 4214 and signal terminals 4215. The ground terminals 4214 and signal terminals 4215 are arranged at intervals, and may have the same pattern of ground and signal terminals as the upper row. Solder pin 4111 and solder pin 4211 point in opposite directions. The ground member 44 electrically connects ground terminal 4114 and ground terminal 4214.

The center-to-center spacing between the adjacent upper row terminals 411 may be 0.8 mm. The first, fourth, seventh, thirteenth, sixteenth and nineteenth (counted from left to right) of the upper row terminals 411 may be terminals 4114 and the others may be terminals 4115. The center-to-center spacing between the adjacent lower row terminals 421 may be 0.8 mm. The first, fourth, seventh, thirteenth, sixteenth and nineteenth (counted from left to right) of the lower row terminals 421 may be terminals 4214 and the others may be terminals 4215. The upper row terminals 411 and lower row terminals 421 may be made by stamping a copper alloy. The width of the solder pin 4111 and solder pin 4211 may be 0.25 mm. The ground member 44 may electrically connect terminals 4114 and terminals 4214 to reduce the insertion loss and crosstalk during signal transmission.

Figure 8:
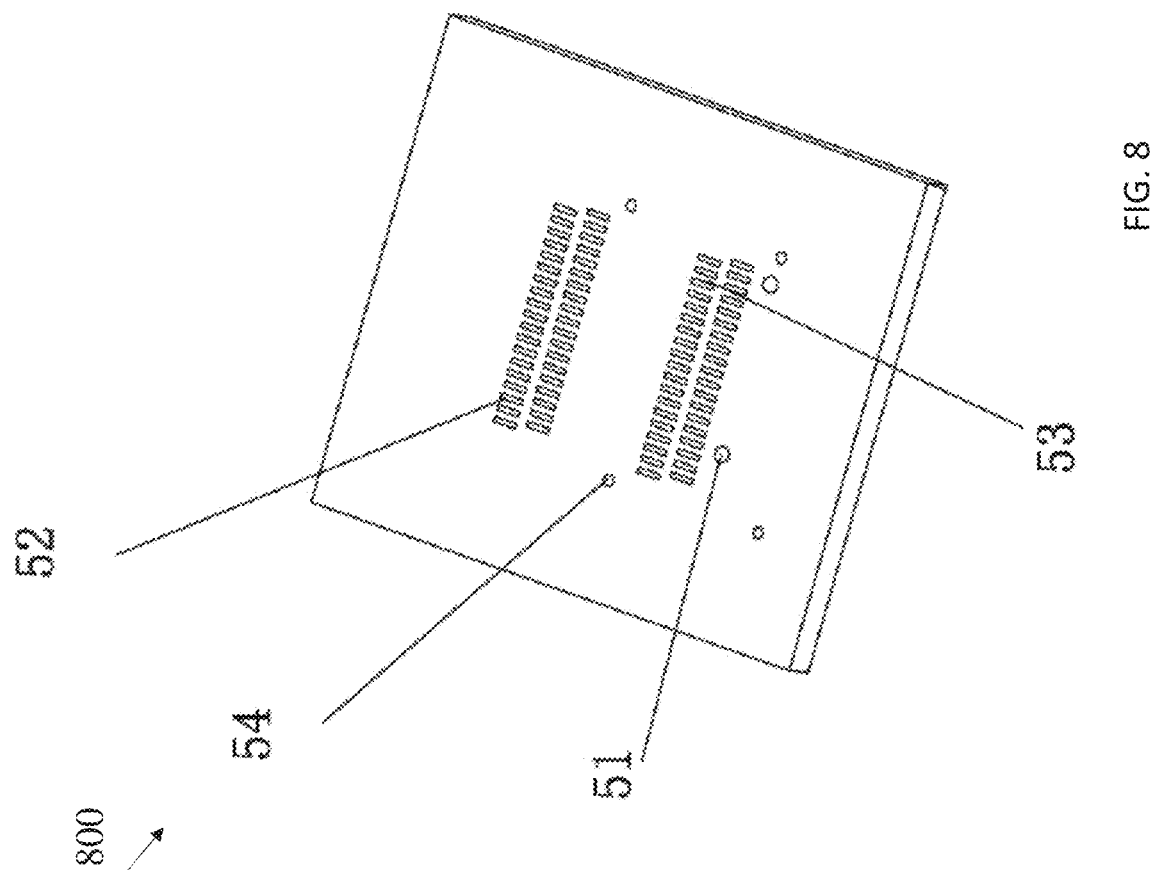
FIG. 8 is a perspective view of the printed circuit board of FIG. 1.

FIG. 8 is a perspective view of the printed circuit board 800. The PCB 800 may be configured to receive the connector 200. The PCB 800 may include a board body 5, which may include locating holes 51 configured to receive posts 13, solder pads 52 configured to receive solder pins 2111 and solder pins 2211, solder pad 53 configured to receive solder pins 4111 and solder pins 4211, and holes 54, which may be through holes, configured to receive anchor pins 3.

In the illustrated example, the diameter of the locating holes 51 is 1.1 mm and two locating holes are provided. The diameter of the through holes 54 is 1.05 mm and four holes 54 are provided. Two rows of solder pads 52 and two rows of solder pads 53 are respectively provided, with nineteen solder pads in each row. The width of the solder pads 52 is 0.35 mm and the width of the solder pads 53 is 0.35 mm, which may be greater than a respective solder pin's width such that low-resistance solder joints may be formed. The center-to-center spacing in a horizontal direction between adjacent the solder pads 52 or solder pads 53 is 0.8 mm. The solder pads 52 and solder pads 53 are distributed on the front side of the PCB. Although the solder pads 52 and 53 are illustrated on the front side, the PCB may include additional solder pads on its back side for a connector with a belly to belly configuration.

Solder pins are adopted for the terminals of the first signal transmitting portion 2 and the second signal transmitting portion 4 to be soldered to a PCB. The solder pins 2111 and solder pins 2211 may be surface-mounted on solder pads 52 of the PCB 800. Solder pins 4111 and solder pins 4211 are surface-mounted on solder pads 53 of the PCB 800. In contrast to conventional mounting of a connector with press-fits, the connector has high density and high speed, and requires a smaller mounting area on a PCB, relaxes the limitations in routing PCB traces, and reduces the electrical performance deterioration caused by PCB trace routing limitations. The terminals 2214 and terminals 2215 are distributed at intervals, improving signal integrity and alleviating signal crosstalk during signal transmission.

In the embodiment illustrated in FIG. 8 pads 53 are in two parallel rows, corresponding to a row to receive solder pins 4111 and another row to receive solder pins 4211. Those rows are offset from each other in the row direction. The row of solder pins 4111 is offset from the row of solder pins 4211 by the same amount. Such an offset in the solder pins 4111 with respect to solder pins 4211 may result from the entirety of each of the terminals 411 being substantially in the same plane and each of the terminals 421 being substantially in the same plane, but the row of terminals 411 being offset from the row of terminals 421. In such a configuration, the mating portions, as well as the intermediate portions of terminals 411 will also be offset from the terminals 421. Alternatively, the terminals 411 and/or 421 may not be substantially within a plane. The solder pins 4111 and/or solder pins 4211 may bend out of the plane containing the mating portions of their respective terminals, for example. As a result, the mating portions of terminals 411 and 421 may be aligned, in a direction perpendicular to the surface of PCB 800, though other portions of opposing terminals may be offset in the row direction.

Similar offsets for some or all of the terminals in rows 211 and 221, which are mounted to pads 52, which are also arrayed in two rows on PCB 800. As with pads 53, the two rows of pads 52 are offset with respect to each other.

It should be understood that various alterations, modifications, and improvements may be made to the structures, configurations, and methods discussed above, and are intended to be within the spirit and scope of the invention disclosed herein.

Further, although advantages of the present invention are indicated, it should be appreciated that not every embodiment of the invention will include every described advantage. Some embodiments may not implement any features described as advantageous herein. Accordingly, the foregoing description and attached drawings are by way of example only.

It should be understood that some aspects of the present technology may be embodied as one or more methods, and acts performed as part of a method of the present technology may be ordered in any suitable way. Accordingly, embodiments may be constructed in which acts are performed in an order different than shown and/or described, which may include performing some acts simultaneously, even though shown and/or described as sequential acts in various embodiments.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Further, terms denoting direction have been used, such as "left", "right", "forward" or "up". These terms are relative to the illustrated embodiments, as depicted in the drawings, for ease of understanding. It should be understood that the components as described herein may be used in any suitable orientation.

Use of ordinal terms such as "first," "second," "third," etc., in the description and the claims to modify an element does not by itself connote any priority, precedence, or order of one element over another, or the temporal order in which acts of a method are performed, but are used merely as labels to distinguish one element or act having a certain name from another element or act having a same name (but for use of the ordinal term) to distinguish the elements or acts.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

As used herein in the specification and in the claims, the phrase "equal" or "the same" in reference to two values (e.g., distances, widths, etc.) means that two values are the same within manufacturing tolerances. Thus, two values being equal, or the same, may mean that the two values are different from one another by ±5%.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

Also, the phraseology and terminology used herein is for the purpose of description and should not be regarded as limiting. Use of terms such as "including," "comprising," "comprised of," "having," "containing," and "involving,"

and variations thereof herein, is meant to encompass the items listed thereafter and equivalents thereof as well as additional items.

The terms "approximately" and "about" if used herein may be construed to mean within ±20% of a target value in some embodiments, within ±10% of a target value in some embodiments, within ±5% of a target value in some embodiments, and within ±2% of a target value in some embodiments. The terms "approximately" and "about" may equal the target value.

The term "substantially" if used herein may be construed to mean within 95% of a target value in some embodiments, within 98% of a target value in some embodiments, within 99% of a target value in some embodiments, and within 99.5% of a target value in some embodiments. In some embodiments, the term "substantially" may equal 100% of the target value.

What is claimed is:

1. An I/O connector comprising:
a first plurality of terminals held in a first row;
a second plurality of terminals held in a second row parallel to the first row;
a plurality of ground members, each of the plurality of ground members comprising a plurality of contact locations separated in a direction parallel to the first row; and
a housing comprising a first slot extending in the direction parallel to the first row, wherein:
terminals of the first plurality of terminals and the second plurality of terminals each comprises a mating portion, a tail and an intermediate portion joining the mating portion and the tail,
at least the mating portions of the first plurality of terminals and the second plurality of terminals are disposed in the first slot,
the intermediate portions of the first plurality of terminals and the second plurality of terminals each comprises a first part and a second part bent at an angle with respect to the first part,
the first plurality of terminals and the second plurality of terminals comprise terminals configured as signal terminals or ground terminals, and
contact locations of the plurality of ground members are connected to the ground terminals of the first plurality of terminals at a first plurality of locations at the first parts of the intermediate portions and at a second plurality of locations at the second parts of the intermediate portions.

2. The I/O connector of claim 1, wherein:
each of the plurality of ground members comprises a strip of material having a bulk conductivity between 1 and 5,000 Siemens/meter.

3. The I/O connector of claim 1, wherein:
the contact locations of at least one of the plurality of ground members are connected to the ground terminals of the first plurality of terminals at the first parts of the intermediate portions, and
the contact locations of at least another one of the plurality of ground members are connected to the intermediate portions of the ground terminals of the first plurality of terminals at the second parts of the intermediate portions.

4. The I/O connector of claim 1, wherein:
the first plurality of terminals comprise signal terminals configured as differential pairs of signal terminals separated by ground terminals.

5. The I/O connector of claim 4, wherein:

the second plurality of terminals comprise signal terminals configured as differential pairs of signal terminals separated by ground terminals; and the ground terminals of the second plurality of terminals are electrically connected to the ground terminals of the first plurality of terminals through at least two of the plurality of ground members.

6. The I/O connector of claim 1, wherein:

the contact locations of at least a third one of the plurality of ground members are connected to the ground terminals of the first plurality of terminals.

7. The I/O connector of claim 6, further comprising:

a third plurality of terminals comprising signal terminals configured as differential pairs of signal terminals separated by ground terminals; and a fourth plurality of terminals comprising signal terminals configured as differential pairs of signal terminals separated by ground terminals.

8. The I/O connector of claim 1, wherein:

the plurality of ground members comprise metal members extending parallel to the first row.

9. The I/O connector of claim 8, wherein:

the contact locations of the plurality of ground members comprise spring fingers.

10. The I/O connector of claim 8, wherein:

a first ground member of the plurality of ground members is connected to the intermediate portions of the ground terminals of the first plurality of terminals at the first parts of the intermediate portions, and a second ground member of the plurality of ground members is connected to the intermediate portions of the ground terminals of the first plurality of terminals at the second parts of the intermediate portions.

11. The I/O connector of claim 10, wherein:

the first and second ground members comprise body portions separated from the signal terminals of the first plurality of terminals, and the contact locations of the first and second ground members comprise projections extending towards the ground terminals of the first plurality of terminals.

12. The I/O connector of claim 1, wherein:

the tails of the first plurality of terminals and the tails of the second plurality of terminals comprise solder pins configured for soldering to a pad on a surface of a printed circuit board, the solder pins of the first plurality of terminals extend in a first direction, and the solder pins of the second plurality of terminals extend in a second direction, opposite the first direction.

13. The I/O connector of claim 12, wherein:

the housing comprises a mounting face and the tails of the first plurality of terminals and the second plurality of terminals are exposed at the mounting face;

the housing comprises at least one post extending from the mounting face; and the I/O connector further comprises a plurality of anchor pins attached to the housing, each of the anchor pins comprising a pair of spring arms extending towards opposite directions.

14. An electrical connector comprising:

a housing comprising first and second slots each extending in a row direction and separated from each other in a direction perpendicular to the row direction;

a first terminal subassembly comprising a first plurality of terminals and a first insulative member molded over the first plurality of terminals to hold the first plurality of terminals in a first row of terminals;

a second terminal subassembly comprising a second plurality of terminals and a second insulative member molded over the second plurality of terminals to hold the second plurality of terminals in a second row of terminals;

a third terminal subassembly comprising a third plurality of terminals and a third insulative member molded over the third plurality of terminals to hold the third plurality of terminals in a third row of terminals;

a fourth terminal subassembly comprising a fourth plurality of terminals and a fourth insulative member molded over the fourth plurality of terminals to hold the fourth plurality of terminals in a fourth row of terminals; and a first ground member, a second ground member and a third ground member, each of the first, second and third ground members being separate from one another and comprising a plurality of first portions and a plurality of second portions joining the first portions, wherein:

the terminals of the first plurality of terminals, the second plurality of terminals, the third plurality of terminals, the fourth plurality of terminals each comprises a mating portion, a solder pin and an intermediate portion joining the mating portion and the solder pin, the mating portions of the first and second terminal subassemblies extend into the first slot, the mating portions of the third and fourth terminal subassemblies extend into the second slot, the solder pins are configured for soldering to a pad on a surface of a printed circuit board, the terminals of the first plurality of terminals, the second plurality of terminals, the third plurality of terminals, and the fourth plurality of terminals comprise terminals configured as signal terminals and ground terminals, the plurality of second portions of the first and second ground members comprise body portions separated from the signal terminals of the first plurality of terminals, the plurality of first portions of the first and second ground members comprise contact portions connected to ground terminals of the first plurality of terminals, the plurality of second portions of the third ground member comprise body portions separated from the signal terminals of the third plurality of terminals, and the plurality of first portions of the third ground member comprise contact portions connected to ground terminals of the third plurality of terminals.

15. The electrical connector of claim 14, wherein:

the terminals of the first plurality of terminals, the second plurality of terminals, the third plurality of terminals, and the fourth plurality of terminals comprise signal terminals configured as differential pairs of signal terminals separated by ground terminals.

16. The electrical connector of claim 15, wherein:

the first and second ground members connect the ground terminals of the first plurality of terminals at different locations along a length direction of the first plurality of terminals.

17. An electrical connector, comprising:

a housing comprising a slot extending in a row direction;

a first terminal subassembly comprising a first plurality of terminals and a first insulative member molded over the first plurality of terminals to hold the first plurality of terminals in a first row of terminals;

a second terminal subassembly comprising a second plurality of terminals and a second insulative member molded over the second plurality of terminals to hold the second plurality of terminals in a second row of terminals;

a third terminal subassembly comprising a third plurality of terminals and a third insulative member molded over the third plurality of terminals to hold the third plurality of terminals in a third row of terminals;

a fourth terminal subassembly comprising a fourth plurality of terminals and a fourth insulative member molded over the fourth plurality of terminals to hold the fourth plurality of terminals in a fourth row of terminals; and a plurality of ground members spaced apart from one another, each of the plurality of ground members comprising contact portions and body portions joining the contact portions, wherein:

ground members of the plurality of ground members are disposed within openings of the first insulative member, the second insulative member, the third insulative member, and the fourth insulative member.

18. The electrical connector of claim 17, wherein:

the terminals of the first plurality of terminals and the second plurality of terminals each comprises a mating portion, a solder pin and an intermediate portion joining the mating portion and the solder pin, the mating portions of the first and second terminal subassemblies extend into the slot, and the mating portions of the first plurality of terminals are offset, in the row direction, from the mating portions of the second plurality of terminals.

19. The electrical connector of claim 18, wherein:

the intermediate portions of the first plurality of terminals are offset, in the row direction, from the intermediate portions of the second plurality of terminals.

20. The electrical connector of claim 17, wherein:

solder pins of the first plurality of terminals and of the second plurality of terminals extend at a right angle relative to respective mating portions of the first plurality of terminals and the second plurality of terminals.

* * * * *